(12) United States Patent
Suzuki et al.

(10) Patent No.: US 7,511,290 B2
(45) Date of Patent: Mar. 31, 2009

(54) CHARGED PARTICLE BEAM WRITING METHOD AND APPARATUS

(75) Inventors: Junichi Suzuki, Saitama (JP); Keiko Emi, Ibaraki (JP); Takayuki Abe, Kanagawa (JP); Tomohiro Iijima, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 271 days.

(21) Appl. No.: 11/671,814

(22) Filed: Feb. 6, 2007

(65) Prior Publication Data

US 2007/0194250 A1    Aug. 23, 2007

(30) Foreign Application Priority Data

Feb. 21, 2006  (JP)  ............................. 2006-043497
Jul. 12, 2006  (JP)  ............................. 2006-191148

(51) Int. Cl.
*A61N 5/00*    (2006.01)
(52) U.S. Cl. ................................. 250/492.22
(58) Field of Classification Search ............. 250/492.22
See application file for complete search history.

(56) References Cited

U.S. PATENT DOCUMENTS 5,933,212 A * 8/1999 Kasuga ........................ 355/20

2007/0192757 A1 * 8/2007 Emi et al. ........................ 716/20

FOREIGN PATENT DOCUMENTS

| JP | 11-204415 | 7/1999 |
| JP | 3680425 | 5/2005 |
| JP | 2005-195787 | 7/2005 |

OTHER PUBLICATIONS

U.S. Appl. No. 11/460,848, filed Jul. 28, 2006, Keiko Emi, et al.
U.S. Appl. No. 11/535,725, filed Sep. 27, 2006, Junichi Suzuki, et al.

* cited by examiner

*Primary Examiner*—Kiet T Nguyen
(74) *Attorney, Agent, or Firm*—Oblon, Spivak, McClelland, Maier & Neustadt, P.C.

(57) ABSTRACT

A method for writing a pattern on a workpiece by use of a charged particle beam, the method includes calculating a corrected dose including at least a proximity effect correction dose for correction of proximity effect, calculating a corrected residual difference-corrected dose for correcting a correction residual difference of the corrected dose, calculating a exposure dose of the charged particle beam to be corrected by the corrected dose as corrected by the correction residual difference-corrected dose, and irradiating the charged particle beam onto the workpiece in such a way as to become the exposure dose.

19 Claims, 15 Drawing Sheets

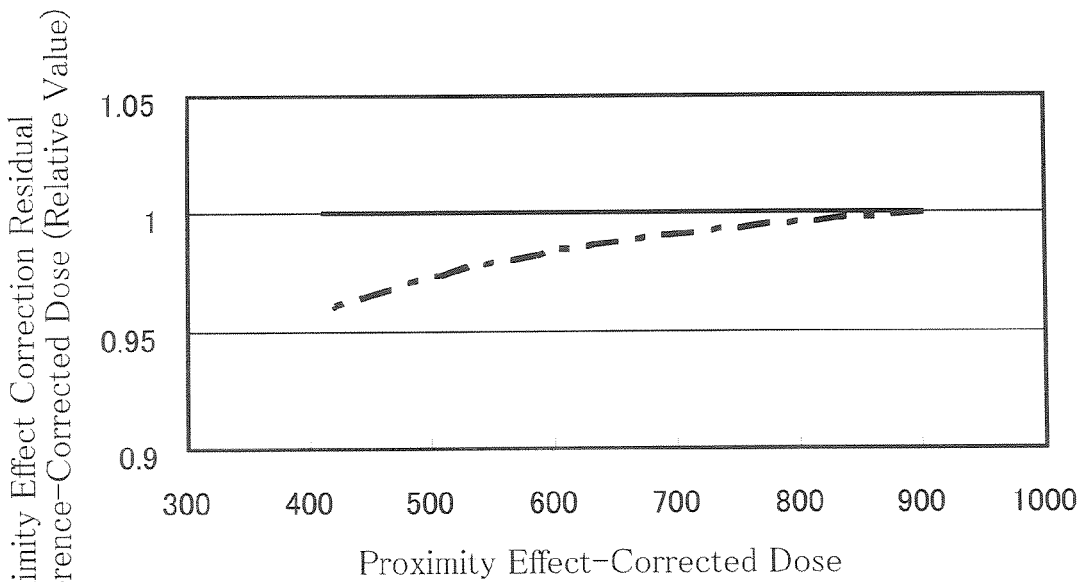
FIG.8
| Coefficient $A_j$ | |
|---|---|
| $A_0$ | 8.60E-01 |
| $A_1$ | 3.11E-04 |
| $A_2$ | -1.73E-07 |
FIG.9
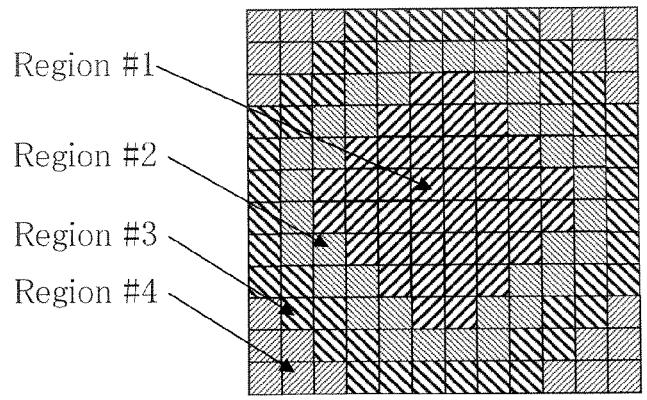
FIG.10

| Coefficient $A_j$ | $A_j(0)$ | $A_j(1)$ | $A_j(2)$ | $A_j(3)$ |
|---|---|---|---|---|
| $A_0$ | 8.60E-01 | 7.82E-01 | 8.70E-01 | 8.23E-01 |
| $A_1$ | 3.11E-04 | 5.48E-04 | 3.10E-04 | 4.05E-04 |
| $A_2$ | -1.73E-07 | -3.32E-07 | -1.58E-07 | -2.40E-07 |

156 : Proximity Effect Correction Residual Difference Correction Data Table

| Ip | k | | | |
|---|---|---|---|---|
| | 0 | 1 | 2 | 3 |
| 0 | 0 | 0 | 0 | 0 |
| 1 | 0 | 0 | 0 | 0 |
| 2 | 0 | 0 | 0 | 0 |
| 3 | 0 | 0 | 0 | 0 |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| 407 | 17 | 20 | 12 | 21 |
| 408 | 17 | 20 | 12 | 21 |
| 409 | 17 | 20 | 12 | 21 |
| 410 | 17 | 20 | 12 | 21 |
| 411 | 17 | 20 | 12 | 21 |
| 412 | 17 | 20 | 12 | 21 |
| 413 | 17 | 20 | 12 | 21 |
| 414 | 17 | 20 | 12 | 21 |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| 894 | 0 | 32774 | 32749 | 6 |
| 895 | 0 | 32774 | 32749 | 6 |
| 896 | 0 | 32774 | 32749 | 6 |
| 897 | 0 | 32774 | 32749 | 6 |
| 898 | 0 | 32774 | 32749 | 6 |
| 899 | 0 | 32774 | 32749 | 6 |
| 900 | 0 | 32774 | 32749 | 6 |
| 901 | 0 | 32774 | 32749 | 6 |
| 902 | 0 | 32774 | 32749 | 6 |
| 903 | 0 | 32774 | 32749 | 6 |
| 904 | 0 | 32774 | 32749 | 6 |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| 2048 | 0 | 32782 | 32725 | 14 |

FIG.15

CHARGED PARTICLE BEAM WRITING METHOD AND APPARATUS

CROSS-REFERENCE TO RELATED APPLICATIONS

This application is based upon and claims the benefit of priority from the prior Japanese Patent Application No. 2006-43497, filed on Feb. 21, 2006 in Japan, and the prior Japanese Patent Application No. 2006-191148 filed on Jul. 12, 2006, the entire contents of which are incorporated herein by reference.

BACKGROUND OF THE INVENTION

1. Field of the Invention

The present invention relates to a charged particle beam pattern writing method and apparatus, and more particularly to a method and apparatus for correcting by a beam dose a pattern size variation amount which takes place due to the so-called proximity effect and the partial opacity like a dark hazy veil or "fog," which occur due to electron beam pattern writing by way of example, and a pattern size variation amount which takes place due to loading effects during pattern formation after the electron beam writing.

2. Related Art

A lithography technique which bears advances in miniaturization of semiconductor devices is a very important process which is only a process for generating patterns among semiconductor fabrication processes. In recent years, with an increase in integration density of LSI, the circuit line width required for semiconductor devices is decreasing year by year. In order to form a desired circuit pattern for these semiconductor devices, an original image pattern (called a reticle or a mask) of high accuracy becomes necessary. Here, an electron ray (electron beam) pattern writing technique inherently has excellent resolution and is for use in the manufacture of high-accuracy original image patterns.

FIG. 21 is a conceptual diagram for explanation of an operation of one prior known variable-shaped electron beam lithographic apparatus.

In the variable-shaped electron beam lithographic apparatus (electron beam or "EB" pattern writing apparatus), pattern writing is performed in a way which follows. In a first aperture 410, a rectangular or oblong opening 411 for shaping an electron ray 330 is formed. Additionally in a second aperture 420, a variable shaping opening 421 is formed, which is for shaping the electron ray 330 that passed through the opening 411 of the first aperture 410 to have a desired rectangular shape. The electron ray 330 which was emitted from a charged particle source 430 and passed through the opening 411 is deflected by a deflector and then passes through part of the variable shaping opening 421 to fall onto a workpiece 340 that is mounted on a stage. The stage moves continuously in a predetermined one direction (for example, X direction). More specifically, a rectangular shape that can penetrate both the opening 411 and the variable shaping opening 421 is written in a writing region of the workpiece 340 which is mounted on the stage that moves continuously in the X direction. A technique for forming any given shape by letting a beam pass through the opening 411 and variable shaping opening 421 is called the variable shaped beam (VSB) scheme.

When irradiating an electron beam onto a workpiece such as a mask with a resist film deposited thereon, several factors which fluctuate the size of a resist pattern are present, such as proximity effect and fogging. The proximity effect is a phenomenon that electrons irradiated are reflected at the mask and again radiate the resist, an influence range of which is approximately ten-odd μm. On the other hand, the fogging is a multiple scattering-induced resist irradiation phenomenon that back-scatter electrons due to the proximity effect behave to jump out of the resist and scatter again at the lower plane of an electron lens barrel and then reradiate the mask. The fog covers a wide range (several mm to several cm) when compared to the proximity effect. Both the proximity effect and the fog are phenomena for reradiation of the resist, and correction techniques for correcting such factors have been studied until today (for example, refer to JP-A-11-204415). Miscellaneously, a scheme for correcting a loading effect, that is, a size variation caused by a light shield film to be etched in the case of etching such light shield film or the like of a lower layer with a formed resist pattern being as a mask, is well known (for example, see Japanese Patent No. 3680425).

Additionally, in order to correct these proximity and loading effects, an entire circuit pattern is divided into global loading-effect small blocks of a square shape with each side of 500 μm, proximity-effect small blocks of a square shape with each side of 0.5 μm, and micro-loading-effect small blocks of a square shape with each side of 50 nm, respectively, followed by influence degree map preparation. A description as to a technique for calculating a dose for pattern writing by use of a dose (fixed value) capable of properly writing a circuit pattern with predetermined area density of 50% and a proximity effect influence value α map plus a proximity effect correction coefficient η map obtained from a loading effect correction value ΔCD is found in bulletins (for example, see JP-A-2005-195787).

As stated above, in charged particle beam image writing which typically includes electron beam lithography, in cases where an electron beam is irradiated onto a workpiece such as a mask with a resist film deposited and coated thereon, those factors that vary resist pattern sizes exist, examples of which are the proximity effect and the fog. Due to this, for example, upon writing of a pattern which is required to have its accuracy on the order of magnitude of nanometers (nm), problems occur as to generation of an uneven distribution for the finished size of a written pattern due to the influences of the proximity effect and fog. Furthermore, a size variation called the loading effect can take place after the pattern writing. Examples of such loading effect include, but not limited to, a development loading effect of resist film, Cr-loading effect at the time of etching chromium (Cr) that becomes a light shield film underlying the resist film, and a loading effect occurring due to pattern size variations during chemical mechanical polishing (CMP) in wafer manufacturing processes.

On the other hand, in the electron beam pattern writing, further enhanced uniformity of the line width within a mask surface is required with advances in miniaturization of pattern line width. In the case of correcting the above-stated proximity effect or the like by the dose of a beam, a correction quantity is calculated by use of a model equation. However, such model equation has a correction residual difference. And, mask in-plane size variations occurring due to such the proximity effect correction residual difference and fog plus loading effect are about 1 nm/mm, which is moderate when compared to the proximity effect—a variation amount is about 10 to 20 nm. This mask inplane size variation is generated by resist species, resist thickness, resist deposition apparatus or method, post-exposure baking (PEB) apparatus or method, development apparatus or method, etching apparatus or method and others. Hence, a case takes place where size variations due to the correction residual difference are no longer negligible depending upon these resist species, resist thickness, PEB, development irregularities, etc. In addition, in the correction of size variations due to the fog and the loading effect also, achievement of higher accuracy is desired.

BRIEF SUMMARY OF THE INVENTION

It is therefore an object of the present invention to avoid the problems and to provide an image writing method for writing an image at a beam dose which performs size variation correction with higher accuracy and an apparatus for use therewith.

In accordance with one aspect of this invention, a method for writing a pattern on a workpiece by use of a charged particle beam is provided, which includes calculating a corrected dose including at least a proximity effect correction dose for correction of proximity effect, calculating a corrected residual difference-corrected dose for correcting a correction residual difference of the corrected dose, calculating a exposure dose of the charged particle beam to be corrected by the corrected dose as corrected by the correction residual difference-corrected dose, and irradiating the charged particle beam onto the workpiece in such a way as to become the exposure dose.

In accordance with another aspect of the invention, a charged particle beam writing apparatus for writing a pattern on a workplace by use of a charged particle beam, includes a first calculator unit operative to calculate a proximity effect-corrected dose for correction of a size variation of a pattern occurring due to a proximity effect, a second calculator unit operative to calculate a proximity effect correction residual difference-corrected dose for correcting a correction residual difference of the proximity effect-corrected dose, a third calculator unit operative to calculate a fog-corrected dose for correcting a size variation of the pattern due to fog, a fourth calculator unit operative to calculate a loading effect-corrected dose for correction of a size variation of the pattern due to a loading effect, a fifth calculator unit operative to combine together the proximity effect-corrected dose, the proximity effect correction residual difference-corrected dose, the fog-corrected dose and the loading effect-corrected dose to thereby calculate a exposure dose of the charged particle beam, and a writing unit for writing a pattern on the workpiece by irradiating the charged particle beam of the exposure dose.

BRIEF DESCRIPTION OF THE DRAWINGS

FIG. 8 is a diagram showing a relation of proximity effect-corrected dose and proximity effect correction residual difference-corrected dose in the embodiment 1.

FIG. 9 is a diagram showing coefficients of a polynomial equation of a graph indicated by dotted line of FIG. 8.

FIG. 10 is a diagram showing one example of a distribution of proximity effect correction residual difference in the embodiment 1.

FIG. 15 is a diagram showing one example of a proximity effect correction residual difference correction data table in the embodiment 1.

DETAILED DESCRIPTION OF THE INVENTION

Embodiment 1

Figure 1:
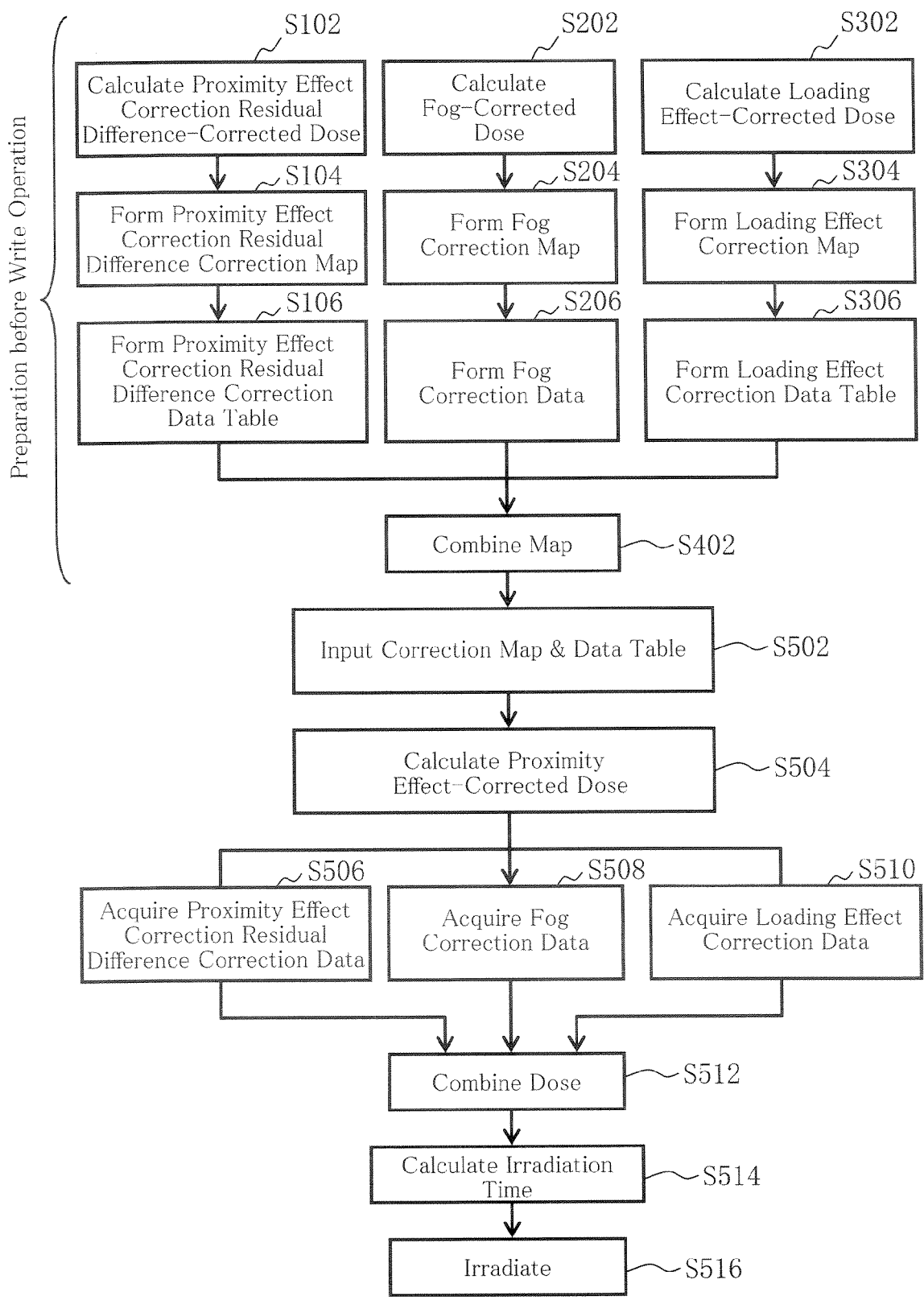
FIG. 1 is a diagram showing main part of a flow chart of an image writing method in an embodiment 1.

In each embodiment below, an explanation will be given of an arrangement using an electron beam as one example of the charged particle beam. Note that the charged particle beam should not exclusively limited to the electron beam and may alternatively be a beam using other charged particles, such as an ion beam or else.

Also note that in an embodiment 1, in order to achieve the proximity effect correction and further correct the above-stated proximity effect correction residual difference and the fogging plus the loading effect, an entire plane of a processed surface of a workpiece such as a mask to be used in the manufacture of semiconductor devices is partitioned into mesh-shaped small regions with each side of about 1 mm for example (three kinds of regions—i.e., a proximity effect correction residual difference mesh region, fog correction mesh region and a loading effect correction mesh region—are set to have the same size because of the use of a correction map to be later described) for preparation of a correction map storing therein correction data in units of such mesh regions and a beam dose correction table while letting the correction values that are stored in the map and the proximity effect-corrected dose be parameters. By using this correction map and the beam dose correction table, write a pattern while changing a correction value with respect to the value of the map and the proximity effect-corrected dose (i.e., pattern density). An explanation thereof will be given using several figures of the drawing below.

FIG. 1 is a diagram showing main part of a flow chart of a pattern writing method in the embodiment 1.

In FIG. 1, an electron beam writing method performs a preparation process prior to an electron beam pattern writing operation and an electron beam writing operation process. As the preparation process prior to the electron beam writing operation, perform exemplary processes including a proximity effect correction residual difference-corrected dose calculation step S102 which becomes one example of a corrected dose calculating step, a proximity effect correction residual difference correction map creating step S104 that becomes one example of a correction residual difference-corrected dose calculating step, a proximity effect correction residual difference correction data table forming step S106, a fog-corrected dose calculating step S202 that becomes one example of a corrected dose calculating step, a fog correction map forming step S204, a fog correction data table forming step S206, a loading effect-corrected dose calculating step S302 that becomes one example of a corrected dose calculation step, a loading effect correction map forming step S304, a loading effect correction data table forming step S306, and a map combining or "synthesis" step S402. Through such the preparation, the electron beam writing method performs, as its writing operation process, exemplary processes such as an input step S502, a proximity effect-corrected dose calculating step S504, a proximity effect correction residual difference correction data acquiring step S506, a fog correction data acquiring step S508, a loading effect correction data acquiring step S510, a dose synthesis step S512, an irradiation time calculating step S514, and an irradiation step S516.

Figure 2:
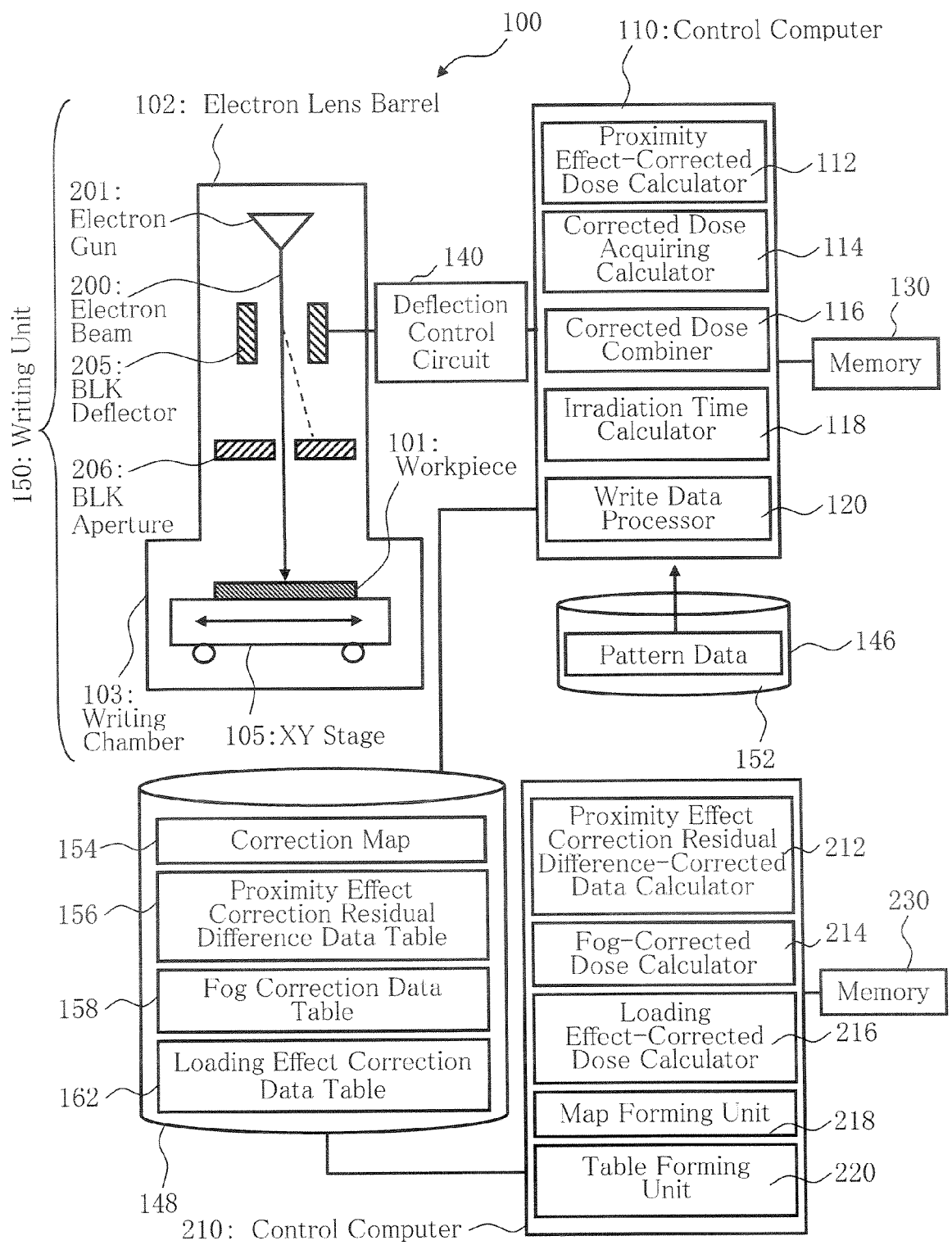
FIG. 2 is a conceptual diagram showing a one example of main arrangement of an image writing apparatus in the embodiment 1.

FIG. 2 is a conceptual diagram showing one example of main-part arrangement of a pattern image writing apparatus in the embodiment 1.

In FIG. 2, a pattern writing apparatus 100 is one example of the charged particle beam image writing apparatus. And the pattern writing apparatus 100 becomes one example of the electron beam writing apparatus. The pattern writing apparatus 100 writes a pattern onto a target object. A workpiece 101 is one of the target object. The workpiece 101 includes a mask to be used for fabrication of a semiconductor device. The pattern writing apparatus 100 has an electron lens barrel 102 and a writing chamber 103 which become a pattern writing unit 150 and includes, as a control system, a control computer 110, a memory 130 that becomes one example of a storage device, a control computer 210, a memory 230 that becomes one example of a storage device, a magnetic disk device 146 that becomes one example of a storage device, a magnetic disk device 148 that becomes one example of storage device, and a deflection control circuit 140. Within the electron lens barrel 102, it has an electron gun 201, a blanking (BLK) deflector 205, and a blanking (BLK) aperture 206. Within the writing chamber 103, it has an XY stage 105. Within the control computer 110, it has respective functions, such as a proximity effect-corrected dose calculating unit 112, a correction dose acquisition calculator unit 114, a dose synthesis unit 116, an irradiation time calculating unit 118, and an image write data processing unit 120. In the control computer 210, it has respective functions such as a proximity effect correction residual difference-corrected dose calculating unit 212, a fog-corrected dose calculating unit 214, a loading effect-corrected dose calculating unit 216, a map creation unit 218, and a table forming unit 220.

To the control computer 110, a bit stream of pattern data 152 as stored in the magnetic disk device 146 is input via the magnetic disk device 146. Similarly, a correction map 154, proximity effect correction residual difference correction data table 156, fog correction data table 158 and loading effect correction data table 162 which are stored in the magnetic disk device 148 are input to the control computer 110 through the magnetic disk device 148. Either the information to be input to the control computer 110 or each information being presently processed and after processing is stored in the memory 130 in every event. Any one of the information being input to the control computer 210 and each information being processed and after processing is stored in the memory 230 in every event.

The memory 130, deflection control circuit 140, magnetic disk device 146 and magnetic disk device 148 are connected to the control computer 110 through a bus (not shown). To the control computer 210, the memory 230 and magnetic disk device 148 are connected via a bus (not shown). The deflection control circuit 140 is connected to the BLK deflector 205.

In FIG. 2, the parts necessary for explanation of the embodiment 1 are illustrated. The writing apparatus 100 may include other arrangements.

Additionally in FIG. 2, although the control computer 110 that becomes one example of the computer is designed to execute the processing tasks of respective functional units such as the proximity effect-corrected dose calculator unit 112, corrected dose acquisition calculator unit 114, dose synthesis unit 116, irradiation time calculator 118, and image write data processor 120, this is not to be construed as limiting the invention, and it is also permissible to employ hardware based on electrical circuitry for practical implementation. Alternatively a combination of such hardware based on electrical circuitry and software may be used for implementation. Still alternatively, a combination of such hardware and firmware may be employed.

Similarly in FIG. 2, although the control computer 210 which becomes one example of the computer is arranged to execute the processings of respective functional units such as the proximity effect correction residual difference-corrected dose calculator unit 212, fog-corrected dose calculator 214, loading effect-corrected dose calculator 216, map creation unit 218 and table forming unit 220, this is not to be construed as limiting the invention, and it is also permissible to employ hardware based on electrical circuitry for reduction to practice. Alternatively a combination of such hardware based on electrical circuitry and software may be used for implementation. Still alternatively, a combination of such hardware and firmware may be used.

An electron beam 200 which is output from the electron gun 201 and which becomes one example of a charged particle beam that is controlled to have a predetermined current density C is irradiated at a desired position of a workplace 101 on the XY stage 105 that is movably disposed. When the electron beam 200 on the workplace 101 reaches an irradiation time which permits the incoming radiation of a desired dose onto the workplace 101, in order to prevent over-irradiation of the electron beam 200 onto the workplace 101, an attempt is made to deflect the electron beam 200 by the blanking deflector 205 of the electrostatic type, for example, and at the same time cut the electron beam 200 by the blanking aperture 206, thereby preventing the electron beam 200 from reaching the top surface of the workplace 101. A deflection voltage of the blanking deflector 205 is controlled by the deflection control circuit 140 and an amplifier, not shown.

In the case of beam ON (blanking OFF), the electron beam 200 exited from the electron gun 201 is expected to progress along an orbit indicated by solid line in FIG. 2. On the contrary, in the case of beam OFF (blanking ON), the electron beam 200 leaving the electron gun 201 is expected to travel along an orbit indicated by dotted line in FIG. 2. Additionally the interior of the electron lens barrel 102 and that of the writing chamber 103 in which the XY stage 105 is disposed are subjected to evacuation by a vacuum pump (not shown), resulting in creation of a vacuum environment which has a pressure lower than an ambient pressure.

Although in FIG. 2 those constituent parts other than the components necessary for the explanation of the embodiment 1 are eliminated from the illustration, the pattern writing apparatus 100 may be arranged to comprise, in addition to the above-stated arrangements, an illumination lens, first aperture, projection lens, shaping deflector, second aperture, objective lens, objective deflector and others within the electron lens barrel 102. With such the arrangement, in the case of the beam ON (blanking OFF), the electron beam 200 leaving the electron gun 201 illuminates, with the aid of the illumination lens, an entirety of the first aperture that has a rectangular opening, for example, an oblong hole. Here, the electron beam 200 is first shaped to have a rectangle, e.g. an oblong. Then, the electron beam 200 of a first aperture image that passed through the first aperture is projected by the projection lens onto the second aperture. A position of the first aperture image on such the second aperture is controlled by the shaping deflector, thereby making it possible to change the beam shape and size. Then, the electron beam 200 of a second aperture image which passed through the second aperture is focused by the objective lens and deflected by the objective deflector and is then irradiated at a desired position of the workpiece 101 on the movably disposed XY stage 105. With the use of such arrangement, it is possible to let it be a variable-shaped beam (VSB) type EB lithographic apparatus.

Prior to entering into the pattern writing operation, there are prepared the correction map 154, proximity effect correction residual difference correction data table 156, fog correction data table 158 and loading effect correction data table 162.

Firstly, a model of the proximity effect will be explained. The proximity effect is the phenomenon that electrons irradiated reflect at a mask and radiate again or "reradiate" a resist, wherein its influence range is approximately ten and several µm. The proximity effect may be represented by the following Equation (1).

$$E = \frac{D_p(x, y)}{2} + \eta \int D_p(x', y') \kappa_p(x - x', y - y') dx' dy' \quad (1)$$

Here, E is the resist absorption amount that is at a constant value, $D_p(x,y)$ is the proximity effect-corrected dose, $\eta$ is the proximity effect correction coefficient, and $\kappa_p(x,y)$ is the proximity effect influence distribution. It is experientially known that the influence distribution $\kappa_p(x,y)$ is proximate to the Gaussian distribution. In addition, the proximity effect correction coefficient $\eta$ and the proximity effect influence distribution $\kappa_p(x,y)$ are obtained in advance through another experimentation. The proximity effect-corrected dose $D_p(x,y)$ satisfies Equation (1) and is representable by Equations (2-1) to (2-4) which follow.

$$D_p(x, y) = \sum_{i=0}^{\infty} D_p^{(i)}(x, y) = D_p^{(0)}(x) + D_p^{(1)}(x) + \cdots \quad (2-1)$$

$$D_p^{(0)}(x, y) = \frac{E}{\frac{1}{2} + \eta U(x, y)} \quad (2-2)$$

-continued $$U(x, y) = \int \kappa_p(x - x', y - y') dx' dy' \quad (2-3)$$

$$D_p^{(n)}(x, y) = \frac{-\eta D_p^{(0)}(x, y)}{E} \left[ \int D_p^{(n-1)}(x', y') \kappa_p(x - x', y - y') dx' dy' - D_p^{(n-1)}(x, y) U(x, y) \right] (n \geq 1) \quad (2-4)$$

Solving Equations (2-1) to (2-4) makes it possible to obtain the proximity effect-corrected dose $D_p(x,y)$. For example, in order to suppress a calculation error of the proximity effect-corrected dose to a level of about 0.5%, calculations may be done to determine $D_p(x,y)$ which takes account of correction terms of up to n=3 per mesh (region) of about 1 µm. Calculation of the actual proximity effect-corrected dose $D_p(x,y)$ along the pattern data 152 will be carried out at S504.

At the step S102 of FIG. 1, as the proximity effect correction residual difference-corrected dose calculating step, the proximity effect correction residual difference-corrected dose calculator unit 212 calculates through computation a proximity effect correction residual difference-corrected dose $d_p(x,y)$ for correcting a correction residual difference of the proximity effect-corrected dose.

Figure 3:
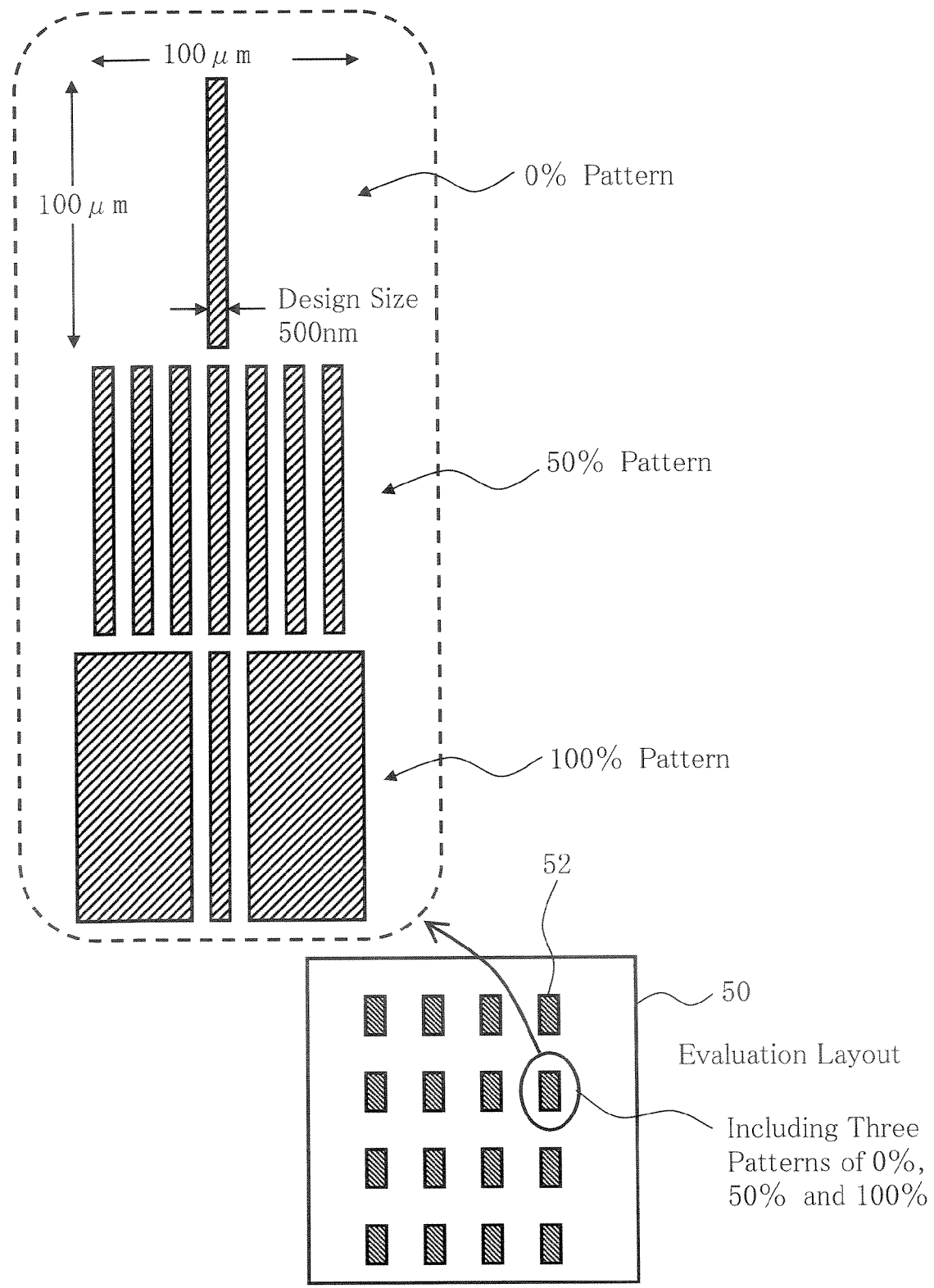
FIG. 3 is a diagram showing one example of a proximity effect correction evaluation pattern in the embodiment 1.

FIG. 3 is a diagram showing one example of a proximity effect correction evaluation pattern in the embodiment 1.

In FIG. 3, a predetermined number of proximity effect correction evaluation patterns 52 are laid out on a substrate 50 while letting a pattern with its pattern density (pattern area density) of almost 0% and several patterns with the pattern density of 50% plus those with the density of almost 100% become a one set. The proximity effect correction evaluation patterns 52 used are regularly disposed to enable evaluation of a size variation at each position of the substrate 50.

First, pattern writing or "drawing" is performed while at the same time changing the proximity effect correction coefficient $\eta$ in such a way that the size is kept constant irrespective of the pattern density at the proximity effect correction evaluation pattern 52 shown in FIG. 3; then, optimize the $\eta$ value. By using this $\eta$, it is possible to obtain from Equation (2) the proximity effect-corrected dose $D_p(x,y)$ that becomes a reference or standard.

Figure 4:
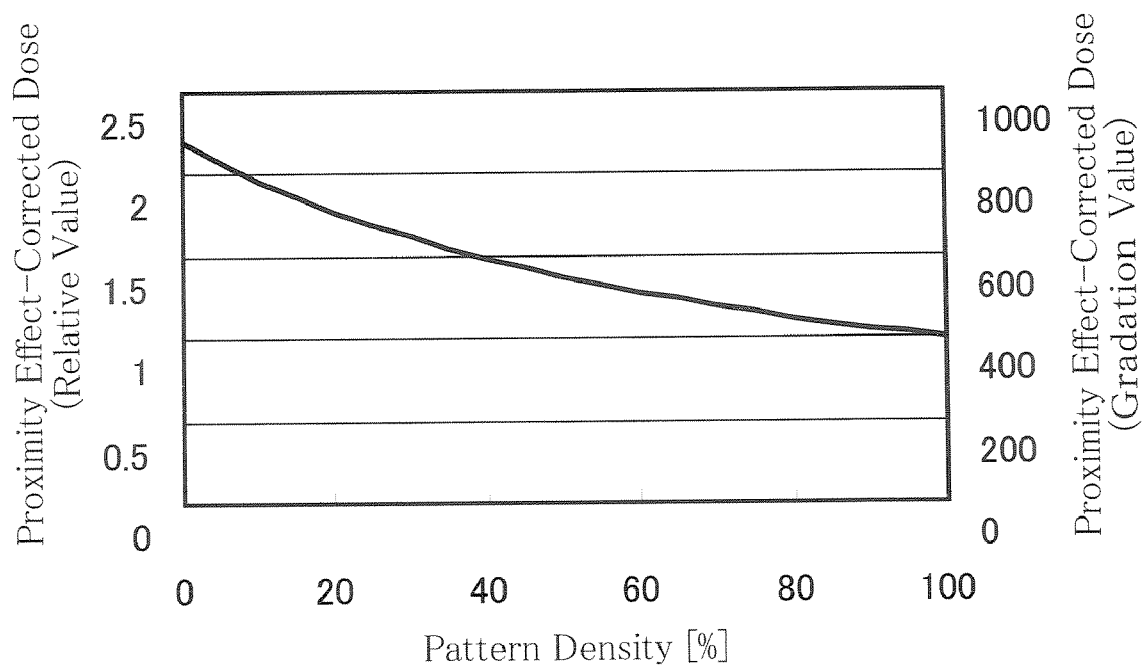
FIG. 4 is a diagram showing a relationship of proximity effect-corrected beam dose versus pattern density in the embodiment 1.

FIG. 4 is a diagram showing a relationship of proximity effect-corrected dose versus pattern density in the embodiment 1.

As shown in FIG. 4, the proximity effect-corrected dose $D_p(x,y)$ is uniquely determined per each pattern (density), so it can be seen that the proximity effect-corrected dose $D_p(x,y)$ has the information of pattern density. While the proximity effect-corrected dose $D_p(x,y)$ is a relative value with respect to a beam dose $D(x,y)$ for actual use in pattern writing, it is processed by the following Equation (3) into 2,048 levels of gradation in order to simplify the calculation processing as digital data.

$$I_p(x, y) = \text{Round}\left\{\frac{2047[D_p(x, y) - D_{\min}]}{D_{\max} - D_{\min}}\right\} \quad (3)$$

Here, $I_p$ indicates a gradation value of the proximity effect-corrected dose $D_p(x,y)$. Round { } is a function for conversion to an integer through half-adjust processing. $D_{max}$ and $D_{min}$ are a maximal value and a minimal value of the gradation range of the proximity effect-corrected dose $D_p(x,y)$, respectively. These are set to be sufficiently larger than the range that the proximity effect-corrected dose $D_p(x,y)$ can take; here, by taking into consideration the available range (1 to 2.2) of the proximity effect-corrected dose $D_p(x,y)$ shown in FIG. 4, let $D_{max}=5$ and $D_{min}=0$, for example.

Figure 5:
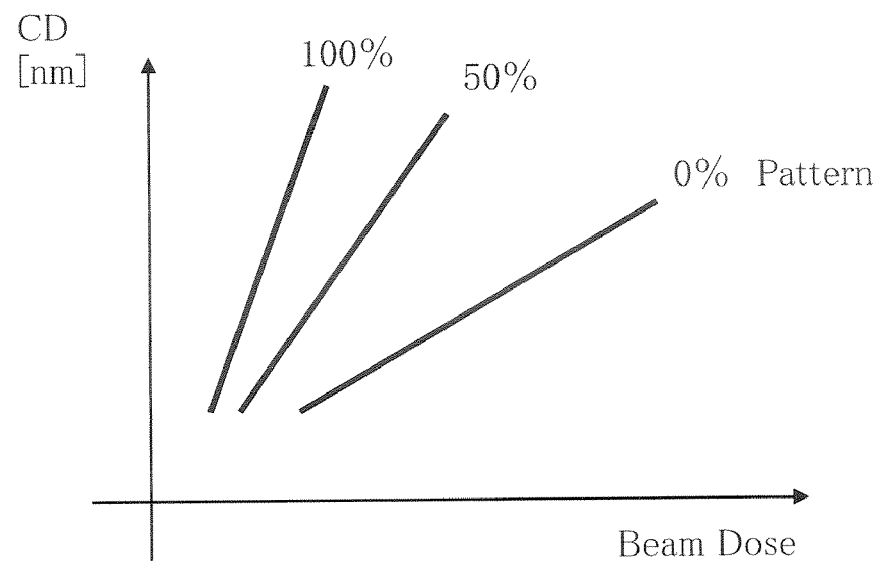
FIG. 5 is a diagram showing a relationship of beam dose and each pattern size in the embodiment 1.

FIG. 5 is a diagram showing a relationship of dose and each pattern size in the embodiment 1.

As shown in FIG. 5, it can be seen that each pattern is different in pattern size variation quantity relative to the dose in a way depending upon the pattern density.

Figure 6:
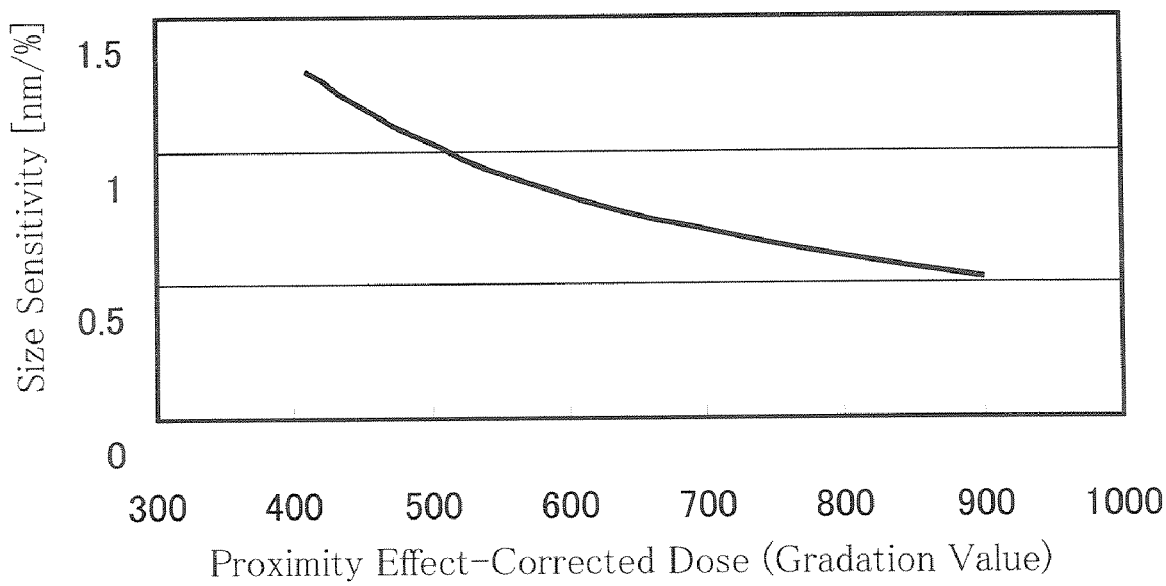
FIG. 6 is a diagram showing a relation of proximity effect-corrected beam dose and size sensitivity in the embodiment 1.

FIG. 6 is a diagram showing a relation of the proximity effect-corrected dose and size sensitivity in the embodiment 1.

The size sensitivity [nm/%] is a size CD variation amount [nm] at the time the dose is changed by 1%. As shown in FIG. 6, the size sensitivity tends to differ on a per-pattern (density) basis. This size sensitivity is used for conversion the size error into a correction dose as will be described later. In FIG. 6, it is indicated by a gradation value $I_p$ of the proximity effect-corrected dose $D_p(x,y)$ with the beam dose being plotted in the abscissa axis.

Note here that Equation 2 which becomes the above-noted proximity effect correction model formula has a correction residual difference: when performing correction by Equation 2, it will possibly happen that the correction residual difference is hardly negligible depending on the resist kind or the like, for example.

Figure 7:
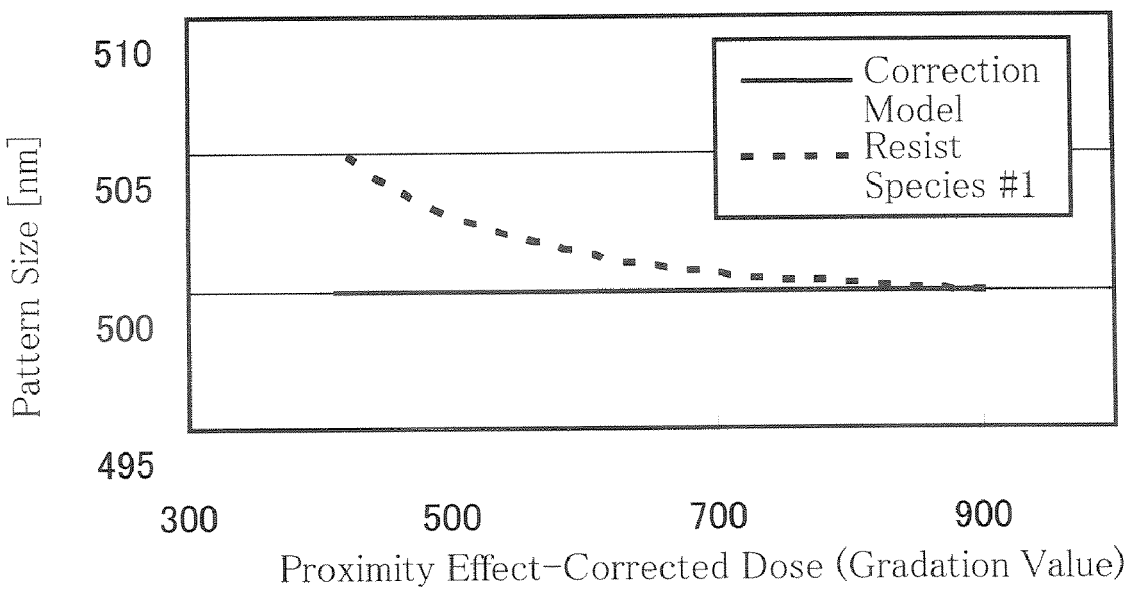
FIG. 7 is a diagram showing a relation of pattern size and proximity effect-corrected dose in the embodiment 1.

FIG. 7 is a diagram showing a relation of pattern size and proximity effect-corrected dose in the embodiment 1.

In FIG. 7, regarding the proximity effect-corrected dose $D_p(x,y)$, it is indicated by a gradation value $I_p$. Here, if the proximity effect correction is perfect, then the pattern size must not depend on the proximity effect-corrected dose $D_p(x,y)$ as shown by a "correction model" indicated by solid line. However, as shown in FIG. 7, it can be seen that a size error, i.e., correction residual difference, is present depending on the resist kind or else for example as shown by dotted line, and the correction residual difference is dependent on the proximity effect-corrected dose—in other words, the pattern density. Such size error is convertable by use of the size sensitivity per proximity effect-corrected dose shown in FIG. 6 into a proximity effect correction residual difference-corrected dose $d_p(x,y)$ which corrects the proximity effect correction residual difference.

FIG. 8 is a diagram showing a relation of proximity effect-corrected dose and proximity effect correction residual difference-corrected dose in the embodiment 1.

A curve in this graph shown by dotted line of FIG. 8 is approximatable by Equation (4) which follows.

$$d_p[I_p(x, y)] = \sum_{j=0}^{N} A_j [I_p(x, y)]^j \qquad (4)$$
$$= A_0 + A_1 I_p(x, y) + A_2 [I_p(x, y)]^2 + \cdots$$

In the multi-term or polynomial formula shown in Equation (4), the coefficient $A_j$ and order N of the polynomial equation are determined so that the residual difference becomes the minimum. Although the polynomial equation is used here, a function system may be chosen arbitrarily.

FIG. 9 is a diagram representing a table which shows the coefficients of the polynomial equation of the graph indicated by dotted line of FIG. 8.

In the example of FIG. 8, the quadratic polynomial equation with the order N=2 becomes optimal, so the coefficient $A_j$ of the polynomial equation (4) becomes a value shown in FIG. 9.

The proximity effect correction residual difference is sometimes different in units of mesh regions within the mask surface due to a resist film thickness and/or development irregularity or else.

FIG. 10 is a diagram showing one example of a distribution of the proximity effect correction residual difference in the embodiment 1.

As shown in FIG. 10, there is a case where the proximity effect correction residual difference is different among regions 1 to 4 on a per-mesh region basis within the mask plane. For the same reason, the size sensitivity is also different in some cases. In view of the fact that the resist film thickness and development irregularity vary on the order of magnitude of from mm to cm, there is shown in FIG. 10 the distribution of proximity effect correction residual difference per mesh region while dividing the mask inplane into square meshes with each side of 1 mm by way of example.

Figure 11:
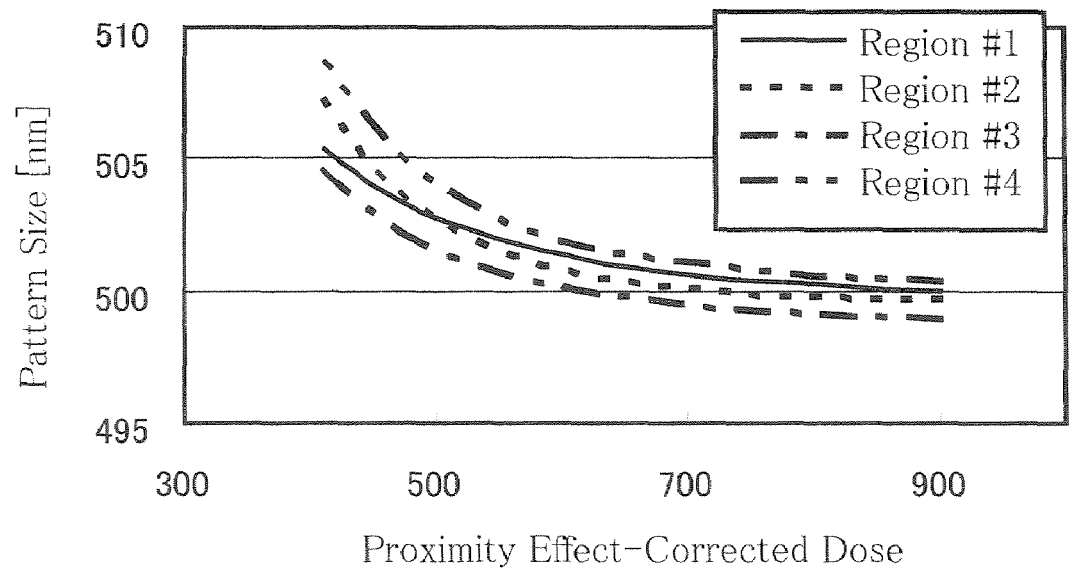
FIG. 11 is a diagram showing a relation of per-region proximity effect-corrected dose and pattern size in the embodiment 1.

FIG. 11 is a diagram showing a relation of per-region proximity effect-corrected dose and pattern size in the embodiment 1.

As shown in FIG. 11, it can be seen that the pattern is such that the pattern size CD relative to the proximity effect-corrected dose is different on a per-region basis. In FIG. 11, the abscissa axis is indicated by the gradation value $I_p$ of the proximity effect-corrected dose $D_p(x,y)$.

Figure 12:
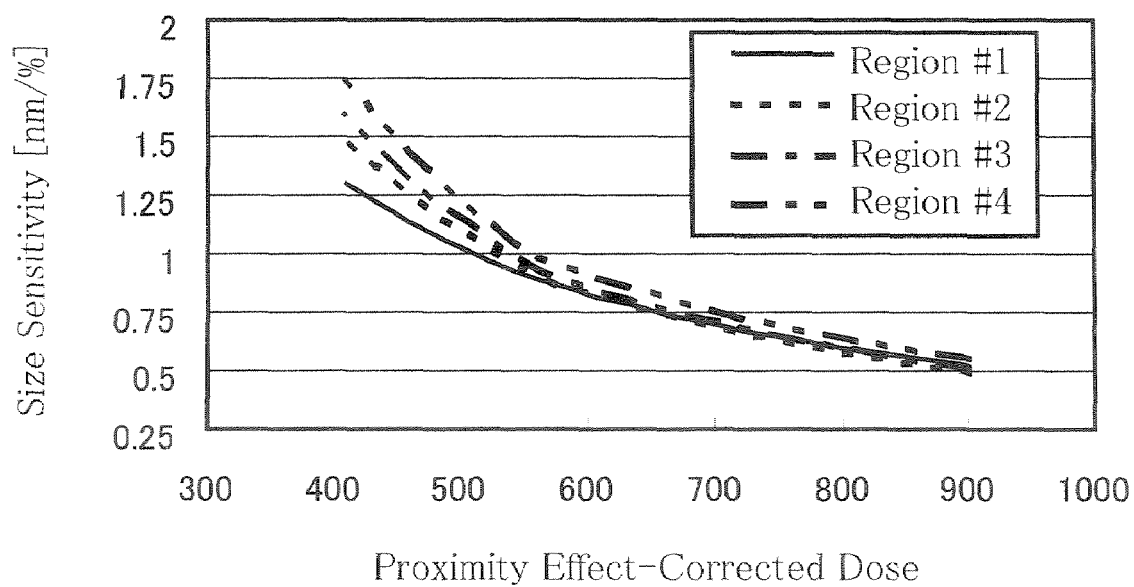
FIG. 12 is a diagram showing a relation of per-region proximity effect-corrected dose and size sensitivity in the embodiment 1.

FIG. 12 is a diagram showing a relation of per-region proximity effect-corrected dose and size sensitivity in the embodiment 1.

Letting the size CD variation amount relative to a proximity effect-corrected dose change shown in FIG. 11 be the size sensitivity [nm/%], it can be seen that the size sensitivity is different in units of regions as shown in FIG. 12. More specifically, the size sensitivity changes at inplane positions of a workpiece. In FIG. 12 also, the abscissa axis is indicated by the gradation value $I_p$ of the proximity effect-corrected dose $D_p(x,y)$.

Figures 13, 14:
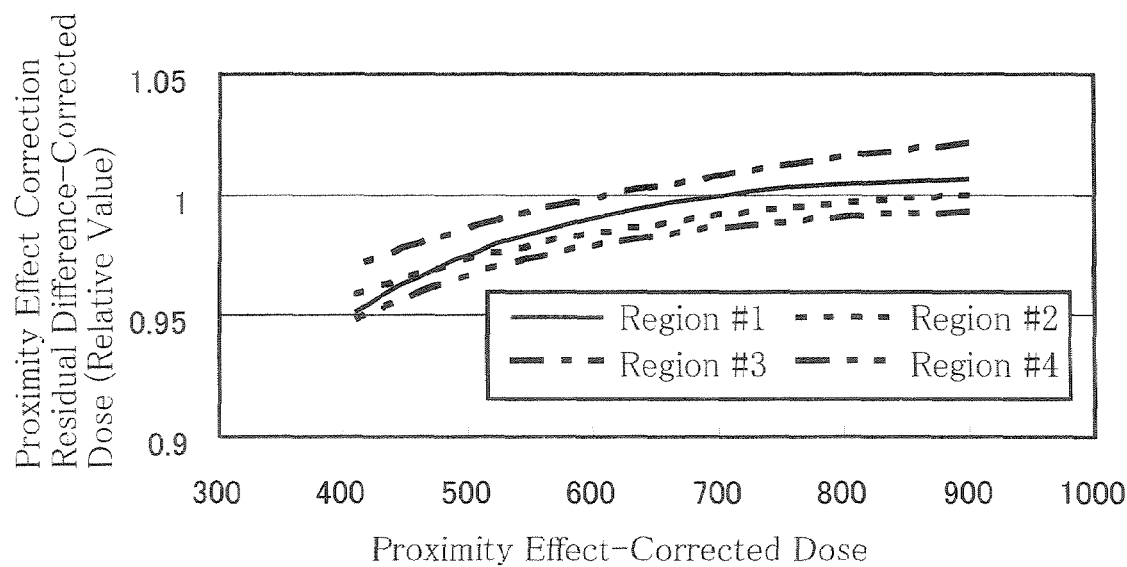
FIG. 13 is a diagram showing a result of obtaining the proximity effect correction residual difference-corrected dose by using the per-region size sensitivity in FIG. 12.
FIG. 14 is a diagram showing the coefficients of a polynomial equation of a graph indicated by per-region dotted line in FIG. 13.

FIG. 13 is a diagram showing a result of obtainment of a proximity effect correction residual difference-corrected dose by using the per-region size sensitivity in FIG. 12.

FIG. 14 is a diagram showing the coefficients of a polynomial equation of a graph which is indicated by per-region dotted line in FIG. 13.

In FIG. 14, a per-region coefficient $A_j(k)$ in the case of fitting by quadratic polynomial equation is shown, wherein "k" is a correction type number which corresponds to four regions (regions 1 to 4)—for example, while letting the region 1 be k=0, the correction type number k takes four separate numerical values of 0 to 3 in the example of FIG. 13, FIG. 14. Additionally the above-noted Equation 4 can be indicated as Equation (5) below. In a similar way to Equation (4), a polynomial equation is used in Equation (5) also; however, a function system is arbitrarily selectable.

$$d_p[I_p(x, y), k] = \sum_{j=0}^{N} A_j(k)[I_p(x, y)]^j \qquad (5)$$
$$= A_0(k) + A_1(k) I_p(x, y) + A_2(k)[I_p(x, y)]^2 + \cdots$$

From the per-region coefficient $A_j(k)$ of FIG. 14 and Equation 5, the proximity effect correction residual difference-corrected dose calculator unit 212 can calculate for each proximity effect-corrected dose the proximity effect correction residual difference-corrected dose $d_p(I_p,k)$ with the gradation value $I_p$ of proximity effect-corrected dose $D_p(x,y)$ and the correction type number k being as variables. In the way stated above, it is possible to obtain the proximity effect-corrected dose from the size sensitivity and then calculate the proximity effect correction residual difference-corrected dose $d_p(I_p,k)$ from the proximity effect-corrected dose thus obtained. It is also permissible to calculate the proximity effect correction residual difference-corrected dose $d_p(I_p,k)$ directly from the size sensitivity while representing the gradation value $I_p$ of proximity effect-corrected dose $D_p(x,y)$ by a function of the size sensitivity. In this way, it is possible to compute the above-stated proximity effect correction residual difference-corrected dose by using the size sensitivity which changes at inplane positions of the workpiece.

At the step S104 of FIG. 1, as the proximity effect correction residual difference correction map forming step, the map creation unit 218 prepares a proximity effect correction residual difference correction map.

As previously stated, since the resist film thickness and the development irregularity vary on the order of magnitude of from mm to cm, the mask inplane is divided into square meshes with each side of 1 mm for example; then, store a correction type number (identifier) to be used at each mesh shown in FIG. 10, and let it be the proximity effect correction residual difference correction map. Here, the value of a correction type number k is stored; thus, in the case of the correction type number k=0 to 4 as an example, an attempt may be done to store it by a 2-bit information amount as the information amount per each mesh region.

At the step S106, as the proximity effect correction residual difference correction data table forming step, the table forming unit 220 uses the calculated proximity effect correction residual difference-corrected dose $d_p(I_p,k)$ to form a proximity effect correction residual difference correction data table which becomes a table of proximity effect correction residual difference correction data $T_p(I_p,k)$ with storage of $I_p$ and k as parameters. In such the proximity effect correction residual difference correction data table, calculate and store therein a value that satisfies Equation (6) which follows.

$$T_p(I_p,k) = \text{Round}\{I_p[1-d_p(I_p,k)]\} \quad (6)$$

When using the example of FIG. 4, the gradation value $I_p$ of proximity effect-corrected dose $D_p(x,y)$ is variable within a range of $409 \leq I_p \leq 901$; thus, to avoid unwanted divergence of the data value, in case the gradation value $I_p$ is less than or equal to 409, the minimum value $I_p=409$ is used for the calculation of the proximity effect correction residual difference-corrected dose $d_p(I_p,k)$ in Equation 6. Similarly, if the gradation value $I_p$ is greater than or equal to 901 then the maximum value $I_p=901$ is used for the calculation of the proximity effect correction residual difference-corrected dose $d_p(I_p,k)$ in Equation 6. Here, the value that proximity effect correction residual difference correction data $T_p(I_p,k)$ of Equation 6 can take falls within a range of from −2,047 to 2,047 when also taking into consideration a case where the proximity effect correction residual difference is negative in polarity. Accordingly, it is preferable to arrange so that the size of one data of the proximity effect correction residual difference correction data table is set to a size of 16 bits, which is greater than this size, to thereby identify by the value of a digit of an upper-level extra bit whether the value of proximity effect correction residual difference correction data $T_p(I_p,k)$ is positive or negative. For example, in case Equation 6 is negative, a value (let it be "1") flagged with the most significant bit is stored in advance.

FIG. 15 is a diagram showing one example of the proximity effect correction residual difference correction data table in the embodiment 1.

In FIG. 15, it can be seen that when $I_p$ is more than or equal to 894 and k takes 1 or 2, the proximity effect correction residual difference correction data $T_p(I_p,k)$ becomes larger in value and is negative.

Next, an explanation will be given of a case for correction of the influence of a size variation occurring due to fog and/or loading effect as one example of global size (GCD) correction. When there is the fog or the loading effect, the above-stated Equation 1 is extended to provide representation as Equation (7) which follows. If there is the fog or loading effect, the Equation (7) is not the only one and may be replaced by a value as indicated in Japanese Patent Application No. 2005-309247 (filing date: Oct. 25, 2005). Now, the contents of JPA 2005-309247 are incorporated herein by reference.

$$E[L(x,y), S(x,y)] = \frac{D(x,y)}{2} + \eta \int D(x',y') \kappa_p(x-x', y-y') dx' dy' + \theta \int D(x',y') \kappa_F(x-x', y-y') dx' dy' \quad (7)$$

Here, $D(x,y)$ is the corrected dose, θ is the fog correction coefficient, $\kappa_F(x,y)$ is the fog influence distribution, $S(x,y)$ is the size sensitivity [nm/%], and $L(x,y)$ is the size error [nm] occurring due to the loading effect. Additionally the size error $L(x,y)$ due to the loading effect may be represented by Equation (8) below.

$$L(x,y) = \gamma \int \rho(x',y') \kappa_L(x-x', y-y') dx' dy' \quad (8)$$

Here, γ is the loading effect correction coefficient [nm], $\rho(x,y)$ is the pattern density, and $\kappa_L(x,y)$ is the loading effect influence distribution. In Equation 1, regarding a resist absorption amount of the left-side term, a solution was obtained in a way such that it becomes a constant value irrespective of the pattern density. Additionally, the loading effect is a phenomenon that the size is changed by a fixed amount without regard to the pattern density. However, as shown in FIG. 12, the size sensitivity varies with a change in gradation value $I_p$ of the proximity effect-corrected dose $D_p(x,y)$. The proximity effect-corrected dose $D_p(x,y)$ varies in accordance with the pattern density. Hence, the size sensitivity is different per pattern density. Since the size sensitivity differs per pattern density, it is necessary to change the resist absorption amount of the left-side term of Equation 8 on a per-pattern density basis. Accordingly, accommodation into Equation (1) is to be done as the phenomenon that the resist absorption amount of the left term changes per pattern density on a per-position basis due to the loading effect.

In addition, the correction dose $D(x,y)$ is obtainable as a product of respective corrected doses as shown by Equation (9) which follows.

$$D(x,y) = D_p(x,y) D_F(x,y) D_L(x,y) \quad (9)$$

In Equation 9, the proximity effect-corrected dose $D_p(x,y)$ satisfies the solution of Equation 1. In addition, here, $D_F(x,y)$ is the fog-corrected dose, and $D_L(x,y)$ is the loading effect-corrected dose.

First, consider a case where the loading effect does not exist. Suppose that a product of the proximity effect-corrected dose $D_p(x,y)$ and fog-corrected dose $D_F(x,y)$ satisfies the following integral equation (10).

$$E = \frac{D_p(x, y)D_F(x, y)}{2} + \quad (10)$$
$$\eta \int D_p(x', y')D_F(x', y')\kappa_p(x-x', y-y')dx'dy' +$$
$$\theta \int D_p(x', y')D_F(x', y')\kappa_F(x-x', y-y')dx'dy'$$

In view of the fact that the influence range (mm to cm) of the fog is extremely wider than the influence range (several tens of μm) of the proximity effect, it is possible to assume that the fog-corrected dose $D_F(x,y)$ is a fixed value in the integration of a second item of the right-side term so that Equation (10) is changeable in form to Equation (11) which follows.

$$E = D_F(x, y)\left[\frac{D_p(x, y)}{2} + \eta \int D_p(x', y')\kappa_p(x-x', y-y')dx'dy'\right] + \quad (11)$$
$$\theta \int D_p(x', y')D_F(x', y')\kappa_F(x-x', y-y')dx'dy'$$

When substituting Equation (1) into Equation (11), it is representable as Equation (12) below.

$$E = D_F(x,y)E + \theta \int D_p(x',y')D_F(x',y')\kappa_F(x-x',y-y')dx'dy' \quad (12)$$

Supposing that $D_F(x,y)$ is kept constant within the integration of Equation (12), it is transformable into Equation (13) which follows.

$$D_F(x, y) = \frac{E}{E + \theta \int D_p(x', y')\kappa_F(x-x', y-y')dx'dy'} \quad (13)$$

In case the loading effect is included therein, substituting Equation (9) into Equation (7) results in obtainment of Equation (14) which follows.

$$E[L(x, y), S(x, y)] = \frac{D_p(x, y)D_F(x, y)D_L(x, y)}{2} + \quad (14)$$
$$\eta \int D_p(x', y')D_F(x', y')D_L(x', y')\kappa_p(x-x', y-y')dx'dy' +$$
$$\theta \int D_p(x', y')D_F(x', y')D_L(x', y')\kappa_F(x-x', y-y')dx'dy'$$

In light of the fact that the influence ranges (mm to cm) of the fog and the loading effect are much wider than the influence range (several tens of μm) of the proximity effect, it is possible in Equation (14) to assume that $D_F(x,y)$ and $D_L(x,y)$ are fixed values in the integration of the second item in the right-side term. Additionally supposing that $D_F(x,y)$ and $D_L(x,y)$ are constant in the integration of a third item, Equation (14) becomes Equation (15) which follows.

$$E[L(x, y), S(x, y)] = D_F(x, y)D_L(x, y) \quad (15)$$
$$\left\{\left[\frac{D_p(x, y)}{2} + \eta \int D_p(x', y')\kappa_p(x-x', y-y')dx'dy'\right] + \right.$$
$$\left. \theta \int D_p(x', y')\kappa_F(x-x', y-y')dx'dy'\right\}$$

Then, using Equation 1, Equation (15) becomes Equation (16) below.

$$D_F(x, y)D_L(x, y) = \frac{E[L(x, y), S(x, y)]}{E + \theta \int D_p(x', y')\kappa_F(x-x', y-y')dx'dy'} \quad (16)$$

A numerator on the right side of Equation (16) is transformable, by representing it as a function with a fixed value E being taken outward, into Equation (17) which follows.

$$E[L(x,y),S(x,y)] = E \times H[L(x,y),S(x,y)] \quad (17)$$

Then, substitute Equation (17) into Equation (16), we obtain Equation (18) below.

$$D_F(x, y)D_L(x, y) = \quad (18)$$
$$\frac{E}{E + \theta \int D_p(x', y')\kappa_F(x-x', y-y')dx'dy'} \times H[L(x, y), S(x, y)]$$

Thus, by using Equation (13), the loading effect-corrected dose $D_L(x,y)$ can be represented as Equation (19) which follows.

$$D_L(x,y) = H[L(x,y),S(x,y)] \quad (19)$$

Based on the previous calculation results, first calculate the fog-corrected dose.

At S202, as the fog-corrected dose calculation process, the fog-corrected dose calculator 214 calculates a fog-corrected dose for correction of a size variation of the pattern occurring due to the fog. In order to calculate the fog-corrected dose $D_F(x,y)$, integration of the following Equation (20) which becomes a denominator of Equation (13) is to be executed.

$$Z(x,y) = \int D_p(x',y')\kappa_F(x-x',y-y')dx'dy' \quad (20)$$

Although the integration calculation of Equation (20) may be executed directly, such integration calculation takes much time. Accordingly, assuming that the proximity effect-corrected dose $D_p(x,y)$ is constant within an integration region and also supposing that such value is $E/\{E+\eta V(x,y)\}$, Equation (13) is capable of being calculated as the following Equations (21-1) and (21-2).

$$D_F(x, y) = \frac{\frac{1}{2} + \eta V(x, y)}{\frac{1}{2} + \eta V(x, y) + \theta V(x, y)} \quad (21\text{-}2)$$

$$V(x, y) = \int \kappa_F(x-x', y-y')dx'dy' \quad (21\text{-}2)$$

Here, θ and the fog influence distribution $\kappa_F(x,y)$ are determined in advance in such a way that a mask in-plane size after development becomes uniform. Then, calculate Equation 21 in units of 1-mm meshes (per fog correction mesh region).

At step S204 in FIG. 1, as the fog correction map forming process, the map creation unit 218 prepares a fog correction map.

Letting a minimal value of the fog-corrected dose $D_F(x,y)$ be $F_{min}$ and its maximal value be $F_{max}$, the fog-corrected dose $D_F(x,y)$ per each fog correction mesh region is processed to have 64 gradation or graytone levels in accordance with Equation (22) below. Since a size variation amount due to the fog is 10 to 20 nm as stated previously, it is possible by such 64-gradation conversion to obtain a sufficient degree of resolution.

$$I_F(x, y) = \text{Round}\left\{\frac{63[D_F(x, y) - F_{\min}]}{F_{\max} - F_{\min}}\right\} \quad (22)$$

Then, create a fog correction map which stores therein the gradation value $I_F(x,y)$ this calculated.

At step S206, as the fog correction data table forming process, the table forming unit 220 uses the calculated gradation value $I_F(x,y)$ to form a fog correction data table which becomes the table of fog correction data $T_F(I_p,I_F)$ while storing $I_F$ and $I_p$ as parameters. In this fog correction data table, calculate and store a value that satisfies Equation (23) which follows.

$$T_F[I_p, I_F] = \quad (23)$$
$$\text{Round}\{I_p[1 - D_F]\} = \text{Round}\left\{I_p\left[1 - \frac{I_F(F_{\max} - F_{\min})}{63} - F_{\min}\right]\right\}$$

The value that such fog correction data $T_F(I_p,I_F)$ can take ranges from −2,047 to 2,047 when also taking account of a case where the fog-corrected dose is negative. Thus it is preferable that one data size of such the fog correction data table be set to a 16-bit size which is greater than this value while providing an arrangement which uses the value of a digit of an upper-level extra bit to identify whether the value of fog correction data $T_F(I_p,I_F)$ is positive or negative. For example, if Equation 23 is negative then store a value (let it be "1") flagged with the most significant bit.

Next, calculation of a loading effect-corrected dose will be carried out.

At S302, as the loading effect-corrected dose calculation process, the loading effect-corrected dose calculator 216 calculates the loading effect-corrected dose for correction of a size variation of the pattern occurrable due to the loading effect.

Assume here that the pattern size and the beam dose are in a proportional relationship as shown in FIG. 5 for example, when the size variation due to the loading effect is a size variation $L(x,y)$ [nm], the loading effect-corrected dose $D_L(x,y)$ may be represented by Equation (24) which follows.

$$D_L(x, y) = H[L(x, y), S(x, y)] = 1 - \frac{L(x, y)}{100 S(x, y)} \quad (24)$$

$S(x,y)$ is the size sensitivity [nm/%], which is dependent on the proximity effect-corrected dose and a location as shown in FIG. 12. Alternatively, in place of the above-stated proportional relationship, in case the pattern size is proportional to a natural logarithm of the dose, the loading effect-corrected dose $D_L(x,y)$ is also representable by Equation (25) below.

$$D_L(x, y) = H[L(x, y), S(x, y)] = \exp\left[\frac{-L(x, y)}{100 S(x, y)}\right] \quad (25)$$

This size versus dose relation is such that an optimal relational expression may be chosen in conformity to the process.

At S304, as the loading effect correction map creation process, the map creator unit 218 prepares a loading effect correction map.

First calculate a pattern density per 1-mm mesh region; then, in accordance with Equation (8), calculate a size error $L(x,y)$ due to the loading effect per each mesh region.

Letting a minimal value of the size error $L(x,y)$ due to the loading effect be $L_{min}$ and its maximal value be $L_{max}$, the size error $L(x,y)$ due to the loading effect per each mesh region is processed and converted to have 64 gradation levels in accordance with Equation (26) below. As the amount of a loading effect-induced size variation is within the range of 10 to 20 nm as stated previously, the 64-level gradation conversion makes it possible to obtain a sufficient degree of resolution.

$$I_L(x, y) = \text{Round}\left\{\frac{63[L(x, y) - L_{\min}]}{L_{\max} - L_{\min}}\right\} \quad (26)$$

Then, prepare a loading effect correction map which stores therein the gradation value $I_L(x,y)$ thus calculated.

At S306, as the loading effect correction data table forming process, the table forming unit 220 uses the calculated gradation value $I_L(x,y)$ to prepare a loading effect correction data table which becomes the table of loading effect correction data $T_L(I_p,I_L,k)$ as stored with $I_L$, $I_p$ and k being as parameters. In such loading effect correction data table, store a calculated value which satisfies Equation (27) below. Here, as shown in FIG. 12, the size sensitivity $S(x,y)$ depends on the proximity effect-corrected dose (pattern density) and location (region), so it is possible to write it as $S(I_p,k)$. Accordingly, the loading effect correction data $T_L(I_p,I_L,k)$ will be defined by Equation (27) with $I_L$, $I_p$ and k as parameters.

$$T_L[I_p, I_L, k] = \quad (27)$$
$$\text{Round}\{I_p[1 - D_L]\} = \text{Round}\left\{\frac{I_p\left[I_L\frac{(L_{\max} - L_{\min})}{63} + L_{\min}\right]}{100 S(I_p, k)}\right\}$$

A value that the loading effect correction data $T_L(I_p,I_F,k)$ can take becomes −2047 to 2047 when also taking account of a case where the loading effect-corrected dose is negative. Thus, it is preferable to set the data size of one of the loading effect correction data table to 16 bits being greater than this value and employ an arrangement for identifying the fact that the value of the loading effect correction data $T_L(I_p,I_F,k)$ is positive or negative by the value of a digit of upper-level extra bit. For instance, if Equation (27) is negative then store in advance a value (let it be "1") which is flagged with the most significant bit.

In the way stated above, respective correction-use maps were formed in order to perform the proximity effect correction residual difference correction, fog correction and loading effect correction. It is convenient that these maps for respective corrections are combined or "synthesized" together into a single map since each is small in data quantity. To this end, combine the maps together.

At S402, as the map combining process, the map creator 218 combines together the proximity effect correction residual difference correction map, the fog correction map and the loading effect correction map.

Figure 16:
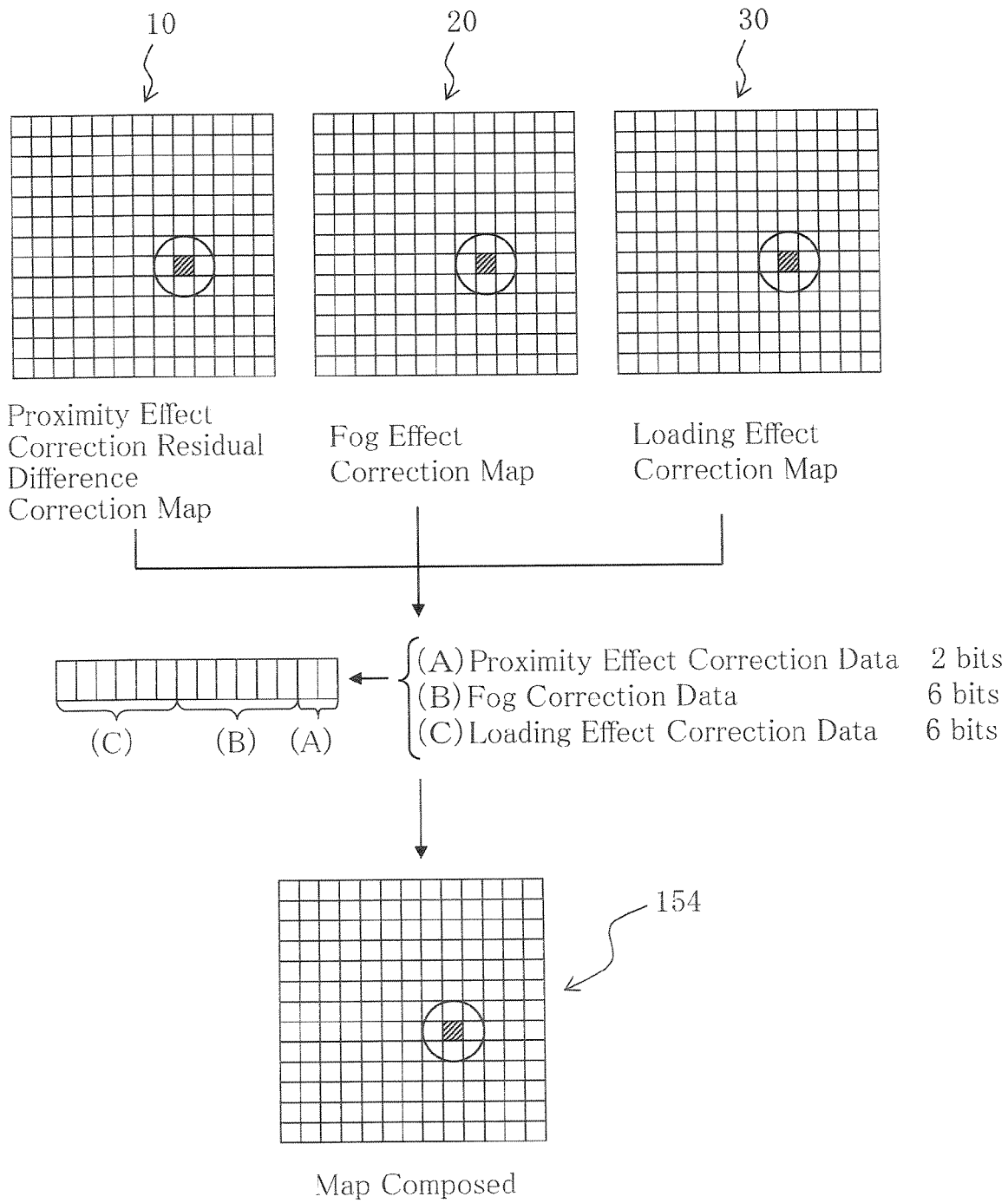
FIG. 16 is a conceptual diagram for explanation of the way of combining correction maps in the embodiment 1.

FIG. 16 is a conceptual diagram for explanation of the way of combining the correction maps in the embodiment 1.

As shown in FIG. 16, the map maker 218 combines the proximity effect correction residual difference correction map 10, fog correction map 20 and loading effect correction map 30 into a single map as the correction map 154. By combining together mesh data (2 bits) of the proximity effect correction residual difference correction map 10, mesh data (6 bits) of the fog correction map 20 and mesh data (6 bits) of the loading effect correction map 30, let it be a map having 14-bit map data on a per-mesh region basis.

The correction map 154, the proximity effect correction residual difference correction data table 156, the fog correction data table 158 and the loading effect correction data table 162 thus created in this way are stored in the magnetic disk device 148. If such the correction map 154 and each table are prepared at a time prior to the start-up of a pattern writing operation, then it is possible to prevent degradation of a writing time period and thus is preferable. Note however that this is not an exclusive example limiting the invention, and it is also permissible to prepare (calculate) it on a real-time basis during a pattern writing operation to be explained later. Below is an explanation of the pattern writing or "drawing" operation under an assumption that the correction map 154 and three respective tables are stored in the magnetic disk device 148.

At S502, as the input process, the control computer 110 inputs respective information items of the correction map 154 and three data tables from the magnetic disk device 148 and inputs pattern data 152 from the magnetic disk device 146. Based on the pattern data 152, the write image data processor 120 forms shot data. Thereafter, calculate the length of an irradiation time t(x,y) at each shot; then, irradiate the electron beam 200 for such irradiation time t(x,y) to thereby write the intended pattern image on the workpiece 101. Although each information of the correction map 154 and three data tables and the pattern data 152 are stored in separate storage devices, these may be stored together in the same storage device when the need arises. More specifically, each information of the correction map 154 and three data tables and the pattern data 152 are storable together in the magnetic disk device 148.

At S504, as the proximity effect-corrected dose calculating process, the proximity effect-corrected dose calculator unit 112 computes a proximity effect-corrected dose $D_p(x,y)$ for correction of a pattern size variation occurring due to the proximity effect in the electron beam writing session for writing a pattern on the workpiece 101 by using the electron beam 200. Then, process the computed proximity effect-corrected dose $D_p(x,y)$ to have several gradation levels. The proximity effect is approximately ten-odd µm in influence range so that computation is performed using Equation 2 in units of mesh regions (proximity effect correction mesh areas) of a square shape with each side of about 1 µm, which are different from the above-stated 1-mm mesh regions (proximity effect correction residual difference correction mesh region, fog correction mesh region, and loading effect correction mesh region).

At S506, as the proximity effect correction residual difference correction data acquiring process, the corrected dose acquisition calculator unit 114 explores and finds from the correction map 154 a mesh region to which belongs the proximity effect correction mesh region with completion of the calculation of the proximity effect-corrected dose $D_p(x,y)$ (i.e., gradation value $I_p$) by the proximity effect-corrected dose calculator unit 112, and then extracts the value of a region type number k as the data of such mesh region. Then, the corrected dose acquisition calculator 114 extracts from the proximity effect correction residual difference correction data table 156 a proximity effect correction residual difference correction data $T_p(I_p,k)$ which corresponds to the proximity effect correction residual difference-corrected dose $d_p(x,y)$ with the gradation value $I_p$ and the region type number k being as parameters.

At S508, as the fog correction data acquisition process, the corrected dose acquisition calculator unit 114 explores and find from the correction map 154 a mesh region to which belongs the proximity effect correction mesh region with completion of the calculation of the proximity effect-corrected dose $D_p(x,y)$ (i.e., gradation value $I_p$) by the proximity effect-corrected dose calculator unit 112, and extracts the value of a gradation value $I_F$ as the data of such mesh region. Then, the corrected dose acquisition calculator 114 extracts from the correction data table 158 a fog correction data $T_F(I_p, I_F)$ corresponding to the fog-corrected dose $D_F(x,y)$ with the gradation value $I_p$ and the gradation value $I_F$ being as parameters.

At S510, as the loading effect-corrected data acquiring process, the corrected dose acquisition calculator 114 explores from the correction map 154 a mesh region to which the proximity effect correction mesh region with completion of the calculation of the proximity effect-corrected dose $D_p(x, y)$ (i.e., gradation value $I_p$) by the proximity effect-corrected dose calculator 112 belongs and then extracts the value of region type number k and the value of a gradation value $I_L$ as the data of such mesh region. Then the corrected dose acquisition calculator 114 extracts from the loading effect correction data table 162 a loading effect correction data $T_L(I_p,I_L,k)$ which corresponds to the loading effect-corrected dose $D_L(x, y)$ with the gradation value $I_p$ and gradation value $I_F$ plus region type number k as parameters.

At S512, as the dose synthesis process, the dose combiner 116 that becomes one example of the dose calculation unit combines together the proximity effect-corrected dose $D_p(x, y)$, the proximity effect correction residual difference-corrected dose $d_p(I_p,k)$, the fog-corrected dose $D_F(x,y)$ and the loading effect-corrected dose $D_L(x,y)$ to thereby compute a corrected dose $D(x,y)$. Then, multiply a reference dose B [µC/cm²] having a unit at the corrected dose $D(x,y)$ that is a relative value, thereby calculating a dose $d(x,y)$ [µC/cm²] of the electron beam 200. Here, calculation is carried out by using $I_p$, $T_p(I_p,k)$, $T_F(I_p,I_F)$ and $T_L(I_p,I_L,k)$ that become respective corresponding gradation-processed values. More specifically, first obtain a gradation value $J(x,y)$ corresponding to the corrected dose $D(x,y)$ by use of Equation (28) which follows.

$$J(x, y) = I_P(x, y) - T_P[I_P(x, y), k(x, y)] - \qquad (28)$$
$$T_F[I_P(x, y), I_F(x, y)] - T_L[I_P(x, y), I_L(x, y), k(x, y)]$$

Note here that in case the most significant bit of $I_p$, $T_p(I_p,k)$, $T_F(I_p,I_F)$, $T_L(I_p,I_L,k)$ is flagged, let its sign be inverted. $J(x,y)$ is a value which was applied 2,048-gradation conversion with the maximum value $D_{max}$ being set to 5 and with the minimum value $D_{min}$ of 0, wherein its takable value ranges from 0 to 2,047. If the calculated value of $J(x,y)$ is less than 0 then let it be 0, and if greater than 2,047 then let it be 2,047, thereby to ensure that the value of $J(x,y)$ does not overflow. To convert $J(x,y)$ that is a gradation value into a real number, the intended result is obtainable by Equation (29) which follows.

$$D(x, y) = \frac{J(x, y)(D_{max} - D_{min})}{2047} - D_{min} \quad (29)$$

At S514, as the irradiation time calculating process, the irradiation time calculator unit 118 is capable of obtaining an irradiation time t(x,y) by dividing the dose d(x,y) by current density C [A/cm²] as indicated by Equation (30) below.

$$t(x, y) = \frac{d(x, y)}{C} = \frac{D(x, y) \cdot B}{C} \quad (30)$$

At S516, as the irradiation process (this is also a pattern writing process), the control computer 110 outputs a signal to the deflection control circuit 140 to ensure that the beam irradiation onto the workpiece 101 becomes OFF upon elapse of the irradiation time t(x,y) thus obtained. In responding to such signal, the deflection control circuit 140 controls the blanking deflector 205 in such a way as to deflect the electron beam 200 in pursuant to the obtained irradiation time t(x,y). After having irradiated the beam having a desired dose d(x,y) onto the workpiece 101, the electron beam 200 which was deflected by the blanking deflector 205 that constitutes the writing unit 150 is shielded or "blocked" by the blanking aperture 206 so that it does not reach the workpiece 101. In this way, the writing unit 150 writes or "draws" by use of the electron beam 200 a pattern image on the workpiece 101 at the desired dose d(x,y).

By correcting or "amending" the beam dose d(x,y) in the way stated above, it is possible to reduce or eliminate the proximity effect correction residual difference and further possible to perform the fog correction and the loading effect correction. This in turn makes it possible to form a pattern with highly accurate pattern sizes.

Note here that although in the embodiment 1 the gradation value J(x,y) which corresponds to the corrected dose D(x,y) that was synthesized by Equation 28 with the use of a gradation value is calculated, the calculation scheme of the corrected dose D(x,y) is not exclusively limited thereto, and it is also preferable to obtain the corrected dose D(x,y) by synthesis with a product of the proximity effect-corrected dose $D_p(x,y)$, proximity effect correction residual difference-corrected dose $d_p(x,y)$, fog-corrected dose $D_F(x,y)$ and loading effect-corrected dose $D_L(x,y)$ Then, a reference dose B [μC/cm²] which has a unit in the corrected dose D(x,y) that is a relative value as obtained by synthesis with such product is multiplied thereto to thereby compute the dose d(x,y) [μc/cm²] of the electron beam 200.

In the way stated above, in the embodiment 1, the proximity effect-corrected dose $D_p(x,y)$ and fog-corrected dose $D_F(x,y)$ plus loading effect-corrected dose $D_L(x,y)$ are calculated as parameters of the corrected dose while the proximity effect correction residual difference-corrected dose $d_p(I_p,k)$ is computed as the parameter of a correction residual difference-corrected dose. By correcting the dose d(x,y) of the electron beam 200 by such parameters, it is especially possible to reduce the correction residual difference. As a result, it is possible to obtain highly accurate pattern sizes. Furthermore, by adding thereto those correction parameters other than the proximity effect, it is possible to obtain pattern sizes with further increased accuracy.

Embodiment 2

If the fog correction by means of the above-stated embodiment 1 is complete, then a distribution of resultant in-plane sizes after development becomes uniform. However, there is a case where a correction residual difference exists due to irregularities of the development and approximation used in calculations or the like. In an embodiment 2, an explanation will be given of a case where a fog correction residual difference dose $D_R(x,y)$ is further added as a parameter of the correction residual difference-corrected dose in the embodiment 1.

Figure 17:
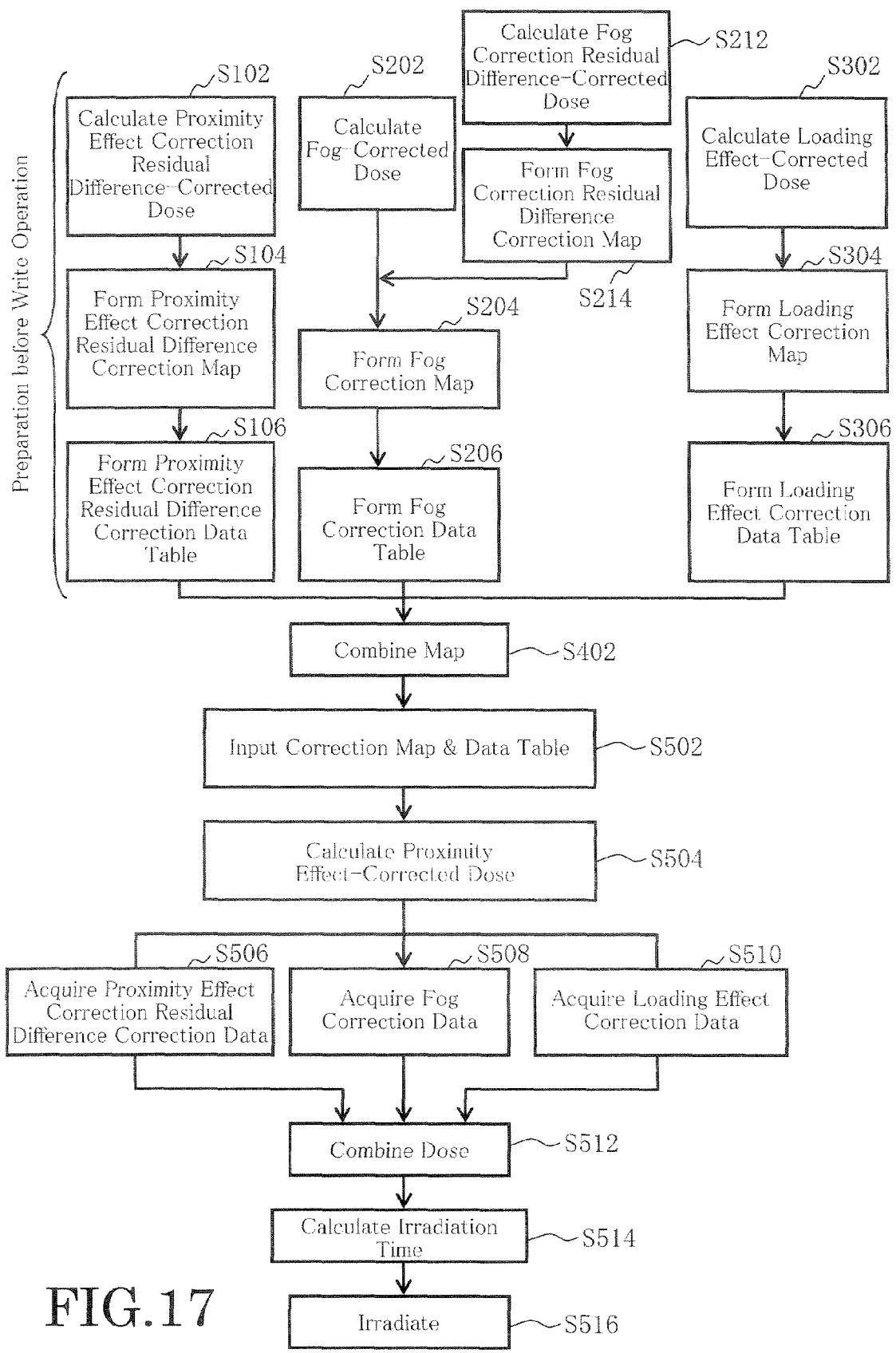
FIG. 17 is a diagram showing main part of a flow chart of an image writing method in an embodiment 2.

FIG. 17 is a diagram showing main part of a flow chart of an electron beam writing method in the embodiment 2.

In FIG. 17, the electron beam writing method performs a preparation process prior to an electron beam writing operation and an electron beam writing operation process. As the preparation process prior to the electron beam writing operation, it performs exemplary processes including a proximity effect correction residual difference-corrected dose calculation step S102, a proximity effect correction residual difference correction map creating step S104 which becomes one example of the correction residual difference-corrected dose calculating step, a proximity effect correction residual difference correction data table forming step S106, a fog-corrected dose calculating step S202, a fog correction map forming step S204, a fog correction data table forming step S206, a fog correction residual difference-corrected dose calculating step S212, a fog correction residual difference map forming step 214, a loading effect-corrected dose calculating step S302, a loading effect correction map forming step S304, a loading effect correction data table forming step S306, and a map synthesis step S402. Through such the preparation, the electron beam writing method performs, as the writing operation process, exemplary processes such as an input step S502, a proximity effect-corrected dose computing step S504, a proximity effect correction residual difference correction data acquiring step S506, a fog correction data acquiring step S508, a loading effect correction data acquiring step S510, a dose synthesis step S512, an irradiation time computing step S514, and an irradiation step S516. In FIG. 17, the process flow as shown herein is similar to that of FIG. 1 with the fog correction residual difference-corrected dose calculating step S212 and the fog correction residual difference correction map forming step (214) being added thereto.

Figure 18:
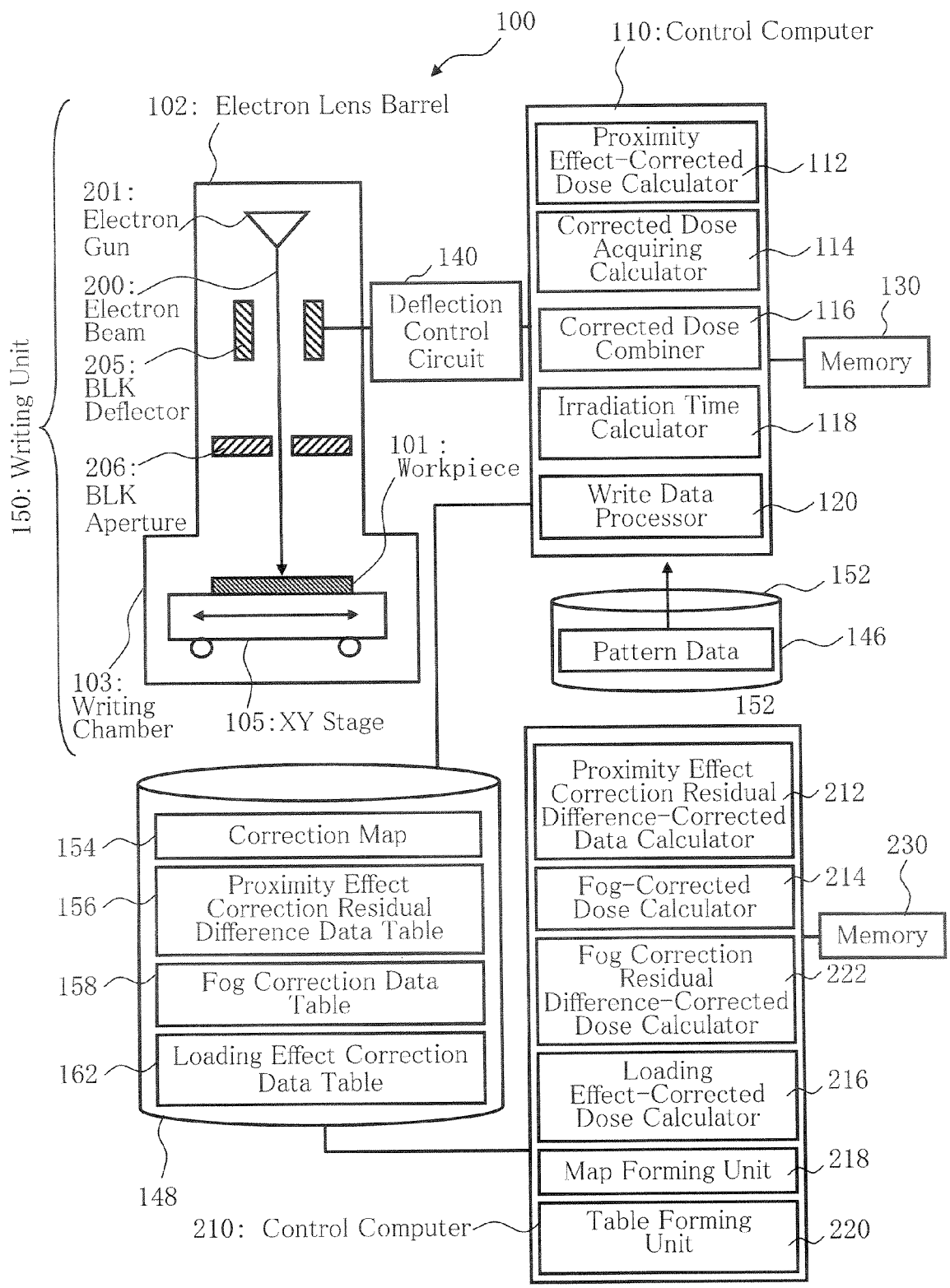
FIG. 18 is a conceptual diagram showing one example of main-part configuration of an image writing apparatus in the embodiment 2.

FIG. 18 is a conceptual diagram showing one example of main-part configuration of a writing apparatus in the embodiment 2.

In FIG. 18, a pattern writing apparatus 100 which is one example of the charged particle beam image writing apparatus and which becomes one example of the electron beam writing apparatus has an electron lens barrel 102 and a writing chamber 103 which become a pattern writing unit 150 and includes, as a control system, a control computer 110, a memory 130 that becomes one example of a storage device, a control computer 210, a memory 230 that becomes one example of a storage device, a magnetic disk device 146 that becomes one example of a storage device, a magnetic disk device 148 that becomes one example of storage device, and a deflection control circuit 140. Within the electron lens barrel 102, it has an electron gun 201, a blanking (BLK) deflector 205, and a blanking (BLK) aperture 206. Within the writing chamber 103, it has an XY stage 105. Within the control computer 110, it has respective functions, such as a proximity effect-corrected dose calculating unit 112, a correction dose acquisition calculator unit 114, a dose synthesis unit 116, an irradiation time calculating unit 118, and an image write data processing unit 120. In the control computer 210, it has respective functions such as a proximity effect correction residual difference-corrected dose calculating unit 212, a fog-corrected dose calculating unit 214, a loading effect-corrected dose calculating unit 216, a map creation unit 218, a table forming unit 220, and a fog correction residual difference-corrected dose calculation unit 222.

In FIG. 18, the system configuration is similar to that shown in FIG. 2 except that the fog correction residual difference-corrected dose calculation unit 222 is added. In FIG. 18 also, similarly to FIG. 2, the control computer 210 that becomes one example of a computer is arranged to execute the processing of the function of the additionally provided fog correction residual difference-corrected dose calculator 222; however, this is not to be construed as limiting the invention, and it is also permissible to employ hardware based on electrical circuitry for implementation. Alternatively a combination of such hardware based on electrical circuitry and software may be used for reduction to practice. Still alternatively, a combination of such hardware and firmware is usable.

In the embodiment 2, repetitive explanations of the parts that are duplicative of those of the embodiment 1 are eliminated herein, and different portions from the embodiment 1 will be explained below. In the embodiment 2, contents with no specific explanations are the same as those in the embodiment 1.

At S212, as the fog correction residual difference-corrected dose calculation process, the fog correction residual difference-corrected dose calculator 222 computes a fog correction residual difference dose $D_S(x,y)$.

Figure 19:
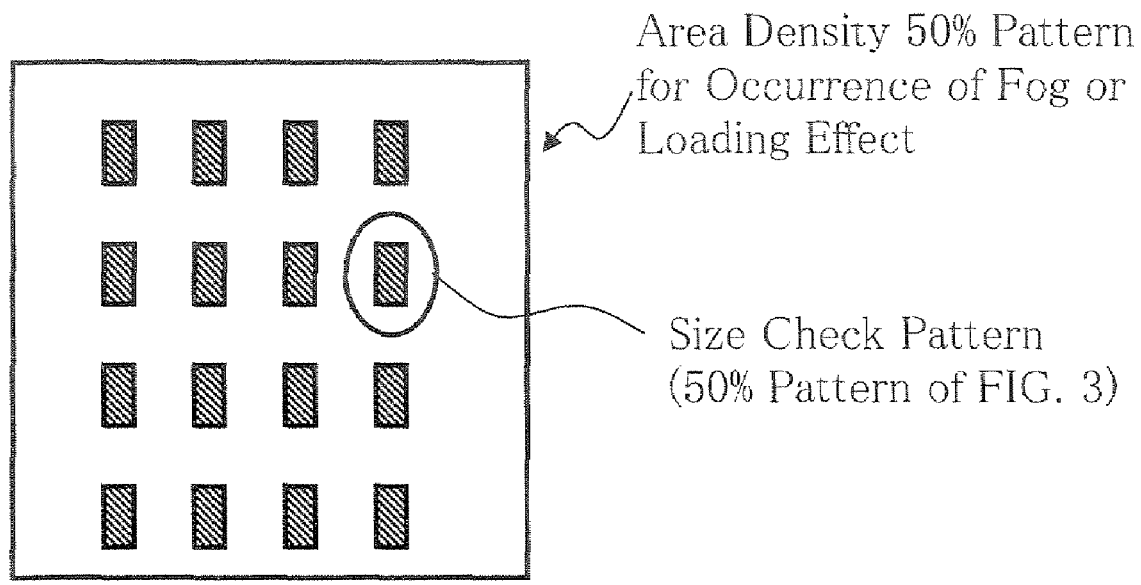
FIG. 19 is a conceptual diagram showing an evaluation layout of the fog and loading effect correction residual differences.

FIG. 19 is a conceptual diagram showing an evaluation layout of fog and loading effect correction residual difference.

Firstly, the correction of the embodiment 1 is performed by using the pattern layout of FIG. 19 to thereby write a pattern; then, measure an in-plane size distribution R(x,y) after development of a 50%-pattern for the size evaluation use shown in FIG. 19. Using the size sensitivity of FIG. 12, the fo correction residual difference dose $D_R(x,y)$ that becomes a beam dose for correction of the fog correction residual difference is obtainable by Equation (31) which follows.

$$D_R(x, y) = 1 - \frac{R(x, y)}{100 S(x, y)} \quad (31)$$

Then, calculate Equation (31) in units of 1-mm mesh regions, thereby to compute the fog correction residual difference dose $D_R(x,y)$ per mesh region.

At S214, as the fog correction residual difference correction map forming process, the map creation unit 218 forms as the fog correction residual difference map a map of per-mesh region fog correction residual difference dose $D_R(x,y)$ thus calculated.

At the fog correction map forming step S204, computation is done while replacing $D_F(x,y)$ by $D_F(x,y) \cdot D_R(x,y)$ in the process of calculating Equation 22. In other words, a product of the fog-corrected dose $D_F(x,y)$ and the fog correction residual difference dose $D_R(x,y)$ is substituted as $D_F(x,y)$ in Equation 22. Consequently, at the fog correction data table forming step S206 also, the fog-corrected data is calculated by the gradation value $I_F$ in which the fog correction residual difference dose $D_R(x,y)$ is considered.

In the way stated above, changing $D_F(x,y)$ to $D_F(x,y) \cdot D_R(x,y)$ makes it possible to obtain the fog correction data which takes account of the fog correction residual difference. Thus it is possible to further increase the accuracy as compared to the embodiment 1.

Additionally, in the case of calculating the corrected dose D(x,y) by use of no gradation values, it is also preferable to obtain the corrected dose D(x,y) by combining or "synthesizing" it with a product of the proximity effect-corrected dose $D_p(x,y)$, proximity effect correction residual difference-corrected dose $d_p(x,y)$, fog-corrected dose $D_F(x,y)$, fog correction residual difference dose $D_R(x,y)$ and loading effect-corrected dose $D_L(x,y)$. Then, a reference dose B [$\mu C/cm^2$] which has a unit in the corrected dose D(x,y) that is a relative value as obtained by synthesis with such product is multiplied thereto to thereby calculate the dose d(x,y) of the electron beam 200.

Embodiment 3

If the loading effect correction by means of the above-stated embodiment 1 is complete then the resulting size distribution after etching becomes uniform. However, there is a case where a correction residual difference exists due to the irregularity of an etching gas(es). In an embodiment 3, an explanation will be given of a case where a loading effect correction residual difference P(x,y) is further added as a parameter for correcting the correction residual difference in the embodiment 1.

Figure 20:
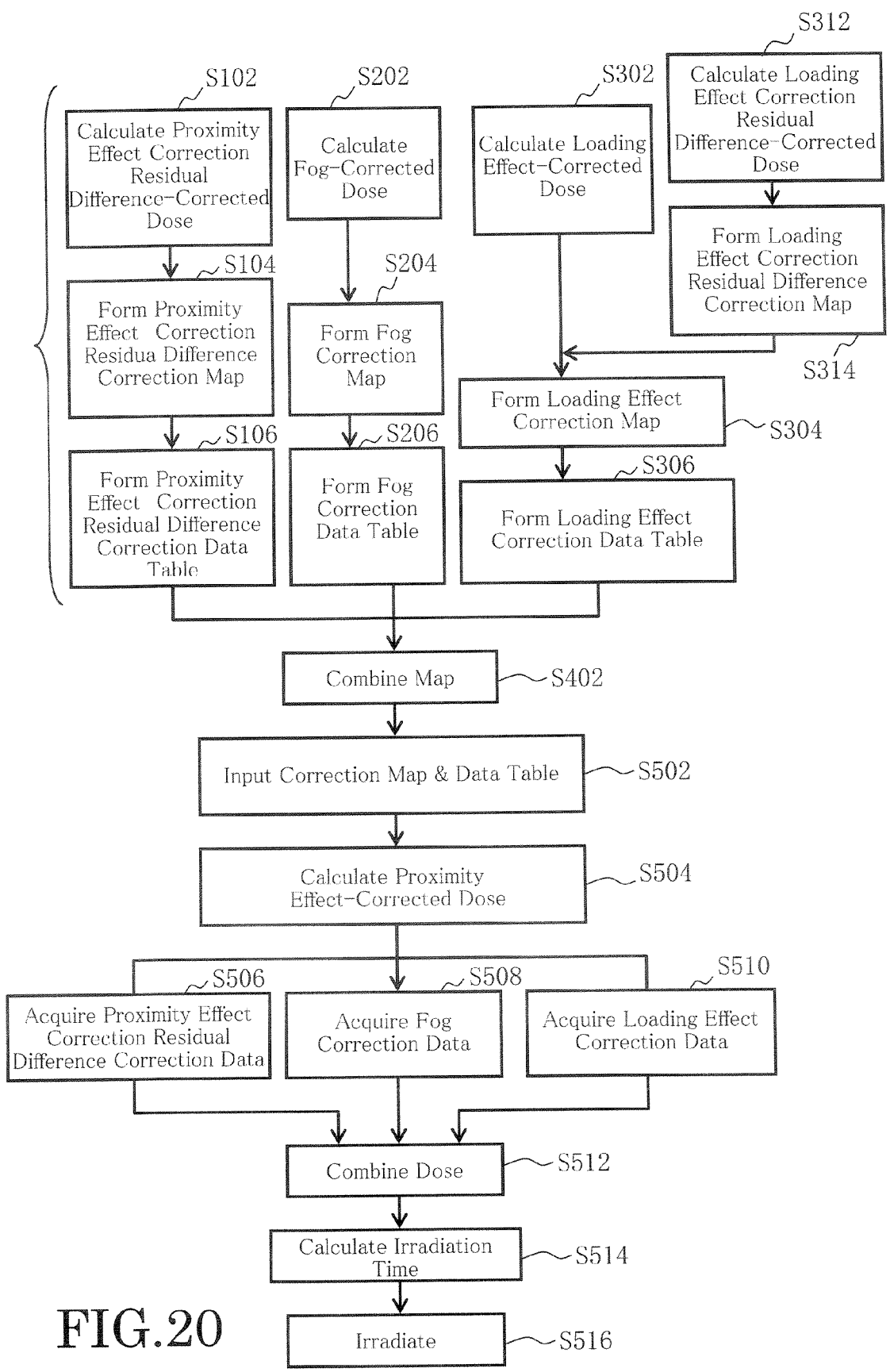
FIG. 20 is a diagram showing main part of a flowchart of an image writing method in an embodiment 3.
Figure 21:
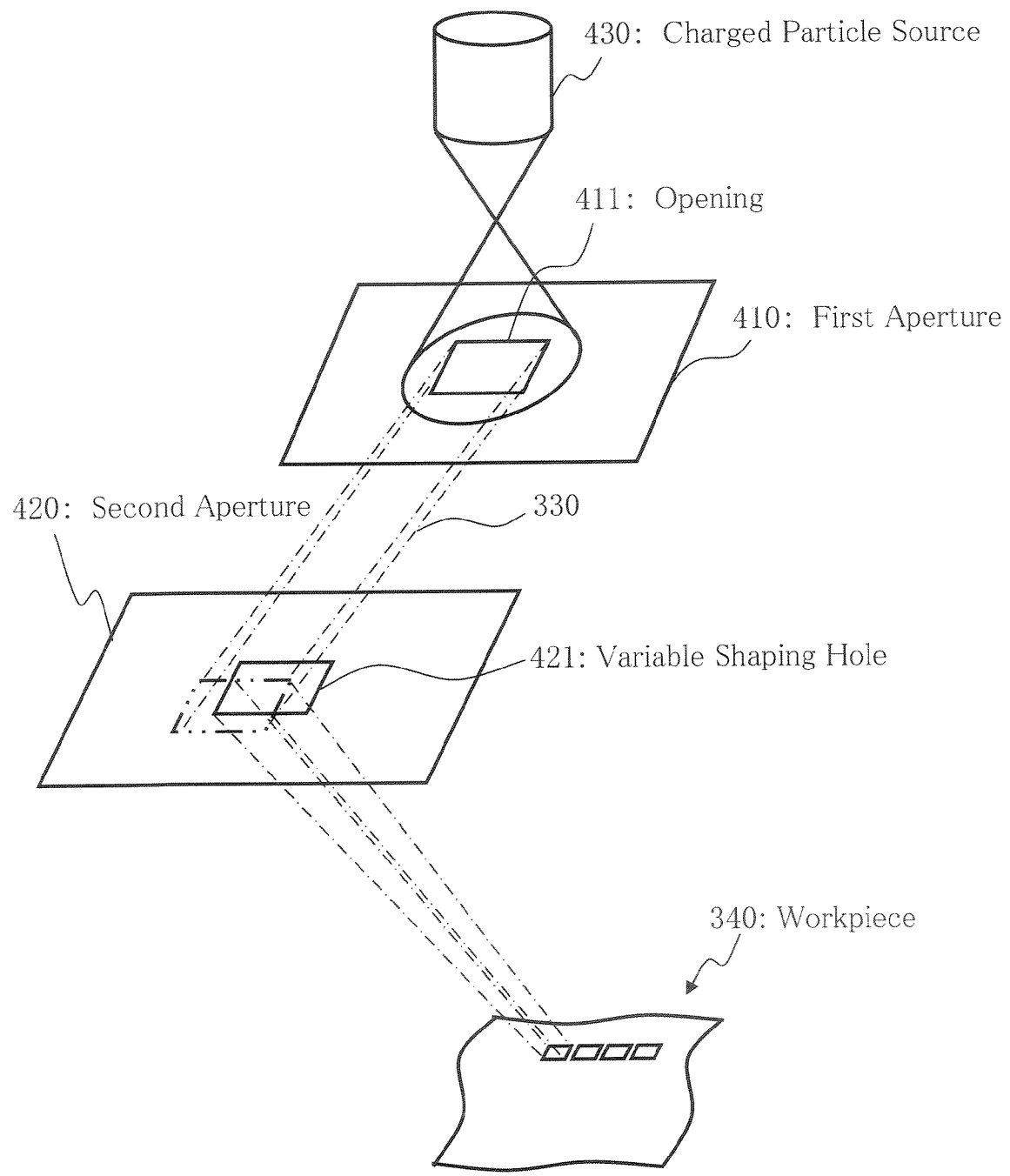
FIG. 21 is a conceptual diagram for explanation of an operation of one prior known variable-shaped electron beam lithographic apparatus.

FIG. 20 is a diagram showing main part of a flowchart of an electron-beam pattern writing method in the embodiment 3.

In FIG. 20, the electron beam writing method performs a preparation process before an electron beam writing operation and an electron beam writing operation process. As the preparation process before the electron beam writing operation, it performs exemplary processes including a proximity effect correction residual difference-corrected dose calculation step S102, a proximity effect correction residual difference correction map creating step S104, a proximity effect correction residual difference correction data table forming step S106, a fog-corrected dose calculating step S202, a fog correction map forming step S204, a fog correction data table forming step S206, a loading effect-corrected dose calculating step S302, a loading effect correction map forming step S304, a loading effect correction data table forming step S306, a loading-effect correction residual difference correction size measuring step S312, a loading effect correction residual difference correction size map forming step S314, and a map synthesis step S402. Through such the preparation, the electron beam writing method performs as the writing operation process exemplary processes such as an input step S502, a proximity effect-corrected dose calculating step S504, proximity effect correction residual difference correction data acquiring step S506, fog correction data acquiring step S508, loading effect correction data acquiring step S510, dose synthesis step S512, irradiation time calculating step S514 and irradiation step S516. In FIG. 20, the procedure shown herein is similar to that of FIG. 1 except that the loading effect correction residual difference correction size computing step S312 and the loading effect correction residual difference correction size map forming step S314 are added thereto. Additionally the configuration of the writing apparatus 100 per se is similar to that of FIG. 2, so its explanation will be omitted herein.

In the embodiment 3, an explanation of the parts that are duplicative of those of the embodiment 1 is omitted, and only different portions from the embodiment 1 will be discussed below. In the embodiment 3, the contents without any specific explanations are the same as those in the embodiment 1.

At S312, as the loading effect correction residual difference correction size measuring process, first perform the correction of the embodiment 1 using the pattern sample of FIG. 19 to thereby write a pattern; then, measure a size distribution P(x,y) of 50%-pattern after etching, which becomes the loading effect correction residual difference correction size.

At S314, as the loading effect correction residual difference correction size map forming process, the map creation unit 218 inputs data of the size distribution P(x,y) and uses this to form a map per 1-mm mesh region.

Then, in case a size error L(x,y) due to the loading effect per each mesh region is calculated based on Equation (8) at the loading effect correction map forming step S304, the calculation is done by using Equation (32) below in place of Equation (8).

$$L(x,y)=\gamma \int \rho(x',y')\kappa_L(x-x',y-y')dx'dy'+P(x,y) \quad (32)$$

Then, the loading effect-induced size error L(x,y) thus calculated by Equation 32 is used to compute a gradation value $I_L(x,y)$, thereby forming a loading effect correction map storing therein such gradation value $I_L(x,y)$. Hence, at the loading effect correction data table forming step S306 also, the gradation value $I_L(x,y)$ that was calculated by taking account of the size distribution P(x,y) of 50% pattern to create a loading effect correction data table that becomes the table of loading effect correction data $T_L(I_p,I_F,k)$ with $I_L$, $I_p$ and k being as parameters.

In this way, in the case of calculating the loading effect-induced size error L(x,y), it is possible by addition of the 50%-pattern size distribution P(x,y) after etching to make the value of the loading effect-induced size error L(x,y) more accurate. As a result, it is possible to further increase the accuracy when compared to the embodiment 1.

In the explanation above, both the embodiment 2 and the embodiment 3 are implemented at a time. This makes it possible to write a pattern at a beam dose with correction of the proximity effect residual difference, fog residual difference and loading effect residual difference.

In the above description, either the processing contents or the operation contents of those recited as " . . . unit" or " . . . step" may be arranged by a software program or programs as executable by computers. Alternatively, it is also permissible to implement them not only by the program that becomes software but also by a combination of hardware and software. Alternatively, even a combination with firmware is also permissible. Additionally, when arranged by such program, the program is recorded on recording media, such as a magnetic disk device, magnetic tape device, FD, read-only memory (ROM) and others. For example, it is recorded to the magnetic disk device 146.

In addition, in FIGS. 2 and 18, it is acceptable that the control computer 110 and/or the control computer 210 acting as the computer is connected via a bus (not shown) to a random access memory (RAM) which becomes one example of the storage device, a ROM, a magnetic disk (HD) device, a keyboard (K/B) that becomes one example of the input means, a mouse, a monitor and/or a printer that becomes one example of the output means, an external interface (I/F) that becomes one example of the input/output means, FD, DVD, CD or the like.

Some embodiments have been explained while referring to practical examples. However, this invention is not limited to these practical examples. For example, although in the embodiments the electron beam writing apparatus of the type using a variable shaped beam scheme, the invention is also applicable to writing apparatuses of any other schemes. Additionally this invention does not limit the purpose of use of electron beam writing apparatus. For example, it is usable for those other than the use purpose of forming a resist pattern directly on masks or wafers and is also employable when forming optical stepper-use masks or X-ray masks or else.

Additionally, the above-described Equation (4), Equation (24) or Equation (31) should not always be arranged to take such the function system. For example, logarithmic proportional expressions may alternatively be used. An optimal form may be chosen in such a way as to fit the process. The mesh size can take any given size as far as it is larger than the mesh size of the proximity effect correction. With standardization to a minimal mesh size, the processing can be done in a simplified way. The bit length may be set to requisite accuracy. The size sensitivity and the proximity effect correction residual difference correction may be made different in region kind. Additionally in case a change amount of the size sensitivity at an in-plane position is less than the required accuracy, it is permissible to use constant (fixed) size sensitivity with no changes at in-plane positions.

Additionally, the fabrication of a semiconductor device is carried out using a wafer, and a mask which becomes the workpiece that was formed by EB writing apparatus is used for the formation of a pattern on such wafer. A pattern of this mask is reduced and transferred onto the wafer. And, it goes through development and etching processes. During the pattern transfer onto this wafer and other processes, size errors can take place in some cases. Since the patterns on the mask are transferred in unison to a wafer at a time, it is necessary to correct in advance size errors of them in the stage of mask preparation. The size error $\epsilon_w(x_w,y_w)$ [nm] on a wafer may be represented by a size error $O_w(x_w,y_w)$ [nm] which is dependent on the pattern area density and a size error $Q_w(x_w,y_w)$ [nm] that depends on the on-wafer position. The pattern area density-dependent size error $O_w(x_w,y_w)$ can be calculated by using a wafer size error correction coefficient $\delta_w$ [nm], pattern area density $\rho$ and wafer size error influence distribution $\kappa_w(x_w,y_w)$ and using Equation (33) which follows.

$$O_w(x_w,y_w)=\delta_w \int \rho(x'_w,y'_w)\kappa_w(x_w-x'_w,y_w-y'_w)dx'_w dy'_w \quad (33)$$

For the wafer size error influence distribution $\kappa_w(x_w,y_w)$, an optimal distribution may be chosen in conformity with measured values. Using the above-stated size errors $O_w(x_w,y_w)$ and $Q_w(x_w,y_w)$, the on-wafer size error $\epsilon_w(x_w,y_w)$ is calculable by use of Equation (34) below.

$$\epsilon_w(x_w, y_w) = O_w(x_w, y_w) + Q_w(x_w, y_w) = \quad (34)$$
$$\delta_w \int \rho(x'_w, y'_w)\kappa_w(x_w - x'_w, y_w - y'_w)dx'_w dy'_w + Q_w(x_w, y_w)$$

A size error $\epsilon(x,y)$ on the mask upon execution of correction on the mask may be computed by using a reduction ratio $\alpha$ upon wafer transfer and by use of Equation (35) which follows.

$$\epsilon(x, y) = \quad (35)$$
$$\frac{\delta_w}{\alpha} \int \rho(x'_w, y'_w)\kappa_w(\alpha x - x'_w, \alpha y - y'_w)dx'_w dy'_w + \frac{1}{\alpha}Q_w(\alpha x, \alpha y)$$

It is preferable here to calculate the on-mask size error $\epsilon(x,y)$ by a mesh size which is about 1/10 of the influence range in the wafer size error influence distribution $\kappa_w$.

Then, the on-mask size error $\epsilon(x,y)$ obtained is added to the loading effect-induced size error $L(x,y)$ as indicated by Equation (32). To make a long story short, the wafer size error is also correctable by using this total value as the loading effect-raised size error $L(x,y)$.

Additionally, although explanations are omitted as to the portions that are not directly necessary for the explanation of this invention, such as apparatus arrangements and control schemes or the like, it is possible to selectively use any appropriate apparatus configurations and control schemes required. For example, an explanation is omitted as to the configuration of a control unit for control of the writing apparatus 100; however, it is needless to say that any required control unit configuration is selectively used on a case-by-case basis.

Miscellaneously, all the pattern forming methods, charged particle beam lithographic tools and charged particle beam lithography methods which are design-alterable by a person skilled in the art are involved in the coverage of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and equivalents thereof.

What is claimed is:

1. A method for writing a pattern on a workpiece by use of a charged particle beam, said method comprising:
   calculating a corrected dose including at least a proximity effect correction dose for correction of proximity effect;
   calculating a corrected residual difference-corrected dose for correcting a correction residual difference of said corrected dose;
   calculating a exposure dose of the charged particle beam to be corrected by said corrected dose as corrected by the correction residual difference-corrected dose; and
   irradiating said charged particle beam onto said workpiece in such a way as to become said exposure dose.

2. The method according to claim 1, wherein as said correction residual difference-corrected dose, a proximity effect correction residual difference-corrected dose for correcting a correction residual difference of said proximity effect-corrected dose is calculated.

3. The method according to claim 2, wherein said proximity effect correction residual difference-corrected dose is calculated by using size sensitivity which changes at an in-plane position of said workpiece.

4. The method according to claim 1, wherein as said corrected dose, in addition to said proximity effect-corrected dose, a loading effect-corrected dose for correcting a size variation of said pattern occurring due to a loading effect, is calculated by using size sensitivity which changes at an in-plane position of said workpiece.

5. The method according to claim 4, wherein a loading effect correction residual difference is added to said loading effect-corrected dose.

6. The method according to claim 4, wherein a value of a size error to be estimated to occur on a wafer which is manufactured using said workpiece as a mask to be used for semiconductor device fabrication is added to said loading effect-corrected dose.

7. The method according to claim 6, wherein a loading effect correction residual difference is further added to said loading effect-corrected dose.

8. The method according to claim 1, wherein as said corrected dose, in addition to said proximity effect-corrected dose, a fog-corrected dose for correcting a size variation of said pattern occurring due to fog is calculated.

9. The method according to claim 8, wherein a correction residual difference of said fog correction is multiplied to the fog-corrected dose.

10. The method according to claim 8, wherein said fog-corrected dose is calculated using size sensitivity which changes at an in-plane position of said workpiece.

11. The method according to claim 1, wherein said workpiece includes a mask to be used for fabrication of a semiconductor device.

12. A charged particle beam writing apparatus for writing a pattern on a workplace by use of a charged particle beam comprising:
   a first calculator unit operative to calculate a proximity effect-corrected dose for correction of a size variation of a pattern occurring due to a proximity effect;
   a second calculator unit operative to calculate a proximity effect correction residual difference-corrected dose for correcting a correction residual difference of said proximity effect-corrected dose;
   a third calculator unit operative to calculate a fog-corrected dose for correcting a size variation of said pattern due to fog;
   a fourth calculator unit operative to calculate a loading effect-corrected dose for correction of a size variation of said pattern due to a loading effect;
   a fifth calculator unit operative to combine together said proximity effect-corrected dose, said proximity effect correction residual difference-corrected dose, said fog-corrected dose and said loading effect-corrected dose to thereby calculate a exposure dose of said charged particle beam; and
   a writing unit for writing a pattern on said workpiece by irradiating said charged particle beam of said exposure dose.

13. The apparatus according to claim 12, further comprising:
   a map creation unit operative to make a map which indicates, by using a plurality of identifiers in units of small regions within a surface of said workpiece, a correction residual difference of said proximity effect-corrected dose being different depending upon an in-plane position of said workpiece;
   a table creation unit operative to make a table storing therein said proximity effect correction residual difference-corrected dose calculated by said second calculator unit while letting said plurality of identifiers and said proximity effect-corrected dose be parameters; and
   an acquisition unit for acquiring said proximity effect correction residual difference-corrected dose by use of said proximity effect-corrected dose calculated by said first calculator unit along with said map and said table, wherein
   said fifth calculator unit uses said proximity effect correction residual difference-corrected dose obtained by said acquisition unit as said proximity effect correction residual difference-corrected dose to be combined.

14. The apparatus according to claim 13, wherein
   said map creation unit further stores in said map a fog-corrected dose per said small region,
   said table creation unit makes a second table which stores, with said proximity effect-corrected dose being as a parameter, said fog-corrected dose calculated by said third calculator unit, said acquisition unit acquires said fog-corrected dose by use of said proximity effect-corrected dose calculated by said first calculator unit and said map plus said second table, and said fifth calculator unit uses, as said fog-corrected dose to be combined, said fog-corrected dose obtained by said acquisition unit.

15. The apparatus according to claim 13, wherein said map creation unit further stores in said map a size variation of said pattern occurring due to a loading effect per said small region, said table creation unit makes a third table which stores said loading effect-corrected dose calculated by said fourth calculator unit with said plurality of identifiers and said proximity effect-corrected dose being as parameters, said acquisition unit acquires said loading effect-corrected dose by using said proximity effect-corrected dose calculated by said first calculator unit and said map and said third table, and said fifth calculator unit uses said loading effect-corrected dose obtained by said acquisition unit as said loading effect-corrected dose to be combined.

16. The apparatus according to claim 12, wherein the calculations performed by the second to fourth calculator units are executed prior to execution of a pattern writing operation to said workpiece.

17. The apparatus according to claim 12, wherein said proximity effect correction residual difference-corrected dose is calculated by using size sensitivity which changes at an in-plane position of said workpiece.

18. The apparatus according to claim 12, wherein said loading effect-corrected dose is calculated by using size sensitivity which changes at an in-plane position of said workpiece.

19. The apparatus according to claim 12, wherein said fog-corrected dose is calculated by using size sensitivity which changes at an in-plane position of said workpiece.

* * * * *